(12) United States Patent
Lu et al.

(10) Patent No.: US 12,581,917 B2
(45) Date of Patent: Mar. 17, 2026

(54) MATCHING PRE-PROCESSING AND POST-PROCESSING SUBSTRATE SAMPLES

(71) Applicant: Lam Research Corporation, Fremont, CA (US)

(72) Inventors: Yu Lu, Palo Alto, CA (US); Yansha Jin, Fremont, CA (US); Zhongkui Tan, Fremont, CA (US); Mehmet Derya Tetiker, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 337 days.

(21) Appl. No.: 18/262,145

(22) PCT Filed: Jan. 19, 2022

(86) PCT No.: PCT/US2022/012979
§ 371 (c)(1),
(2) Date: Jul. 19, 2023

(87) PCT Pub. No.: WO2022/164697
PCT Pub. Date: Aug. 4, 2022

(65) Prior Publication Data
US 2024/0112961 A1     Apr. 4, 2024

Related U.S. Application Data

(60) Provisional application No. 63/199,800, filed on Jan. 26, 2021.

(51) Int. Cl.
H01L 21/66 (2006.01)
G06T 7/33 (2017.01)
(Continued)

(52) U.S. Cl.
CPC .............. H01L 22/12 (2013.01); G06T 7/344 (2017.01); G06T 7/35 (2017.01); G06T 7/62 (2017.01);
(Continued)

(58) Field of Classification Search
CPC ........... H01L 22/12; G06T 7/62; G06T 7/344; G06T 7/35; G06T 2207/20076
See application file for complete search history.

(56) References Cited

U.S. PATENT DOCUMENTS

2016/0313653 A1    10/2016  Mink et al.
2020/0226742 A1     7/2020  Sawlani et al.
(Continued)

FOREIGN PATENT DOCUMENTS

JP        2009532869 A      9/2009
JP        2011517807 A      6/2011
(Continued)

OTHER PUBLICATIONS

International Search Report and Written Opinion dated May 11, 2022, in PCT Application No. PCT/US2022/012979.
(Continued)

*Primary Examiner* — Mohammad M Choudhry
(74) *Attorney, Agent, or Firm* — Weaver Austin Villeneuve & Sampson LLP

(57) ABSTRACT

Various embodiments herein relate to systems, methods, and media for matching pre-processing and post-processing substrate samples. In some embodiments, a computer program product for matching pre-processing and post-processing substrate samples is provided, the computer program product comprising a non-transitory computer-readable on which is provided computer-executable instructions for: receiving a plurality of samples associated with a first set of dimensions characterizing a pre-processed substrate and a plurality
(Continued)

of samples associated with a second set of dimensions characterizing a post-processed substrate; receiving an identification of one of the pre-processed dimensions and one of the post-processed dimensions that are to be matched; generating a first probability distribution of samples for the identified pre-processed dimension and a second probability distribution of samples for the identified post-processed dimension; and matching samples of the identified pre-processed dimension to samples of the identified post-processed dimension based on the first probability distribution and the second probability distribution.

23 Claims, 11 Drawing Sheets

(51) Int. Cl.
    *G06T 7/35*        (2017.01)
    *G06T 7/62*        (2017.01)
(52) U.S. Cl.
    CPC ............... *G06T 2207/20076* (2013.01); *G06T 2207/20228* (2013.01); *G06T 2207/30148* (2013.01)

(56) References Cited

U.S. PATENT DOCUMENTS

| | | | |
|---|---|---|---|
| 2020/0242209 A1 | 7/2020 | Bowes et al. | |
| 2021/0241449 A1* | 8/2021 | Wang | G06T 7/0004 |
| 2022/0120559 A1* | 4/2022 | Zeng | G01B 11/06 |

FOREIGN PATENT DOCUMENTS

| | | |
|---|---|---|
| JP | 2013518449 A | 5/2013 |
| KR | 20090005122 A | 1/2009 |

OTHER PUBLICATIONS

International Preliminary Report on Patentability dated Aug. 10, 2023, in PCT Application No. PCT/US2022/012979.
JP Office Action dated Dec. 23, 2025 in JP Application No. 2023543285, with English Translation.

* cited by examiner

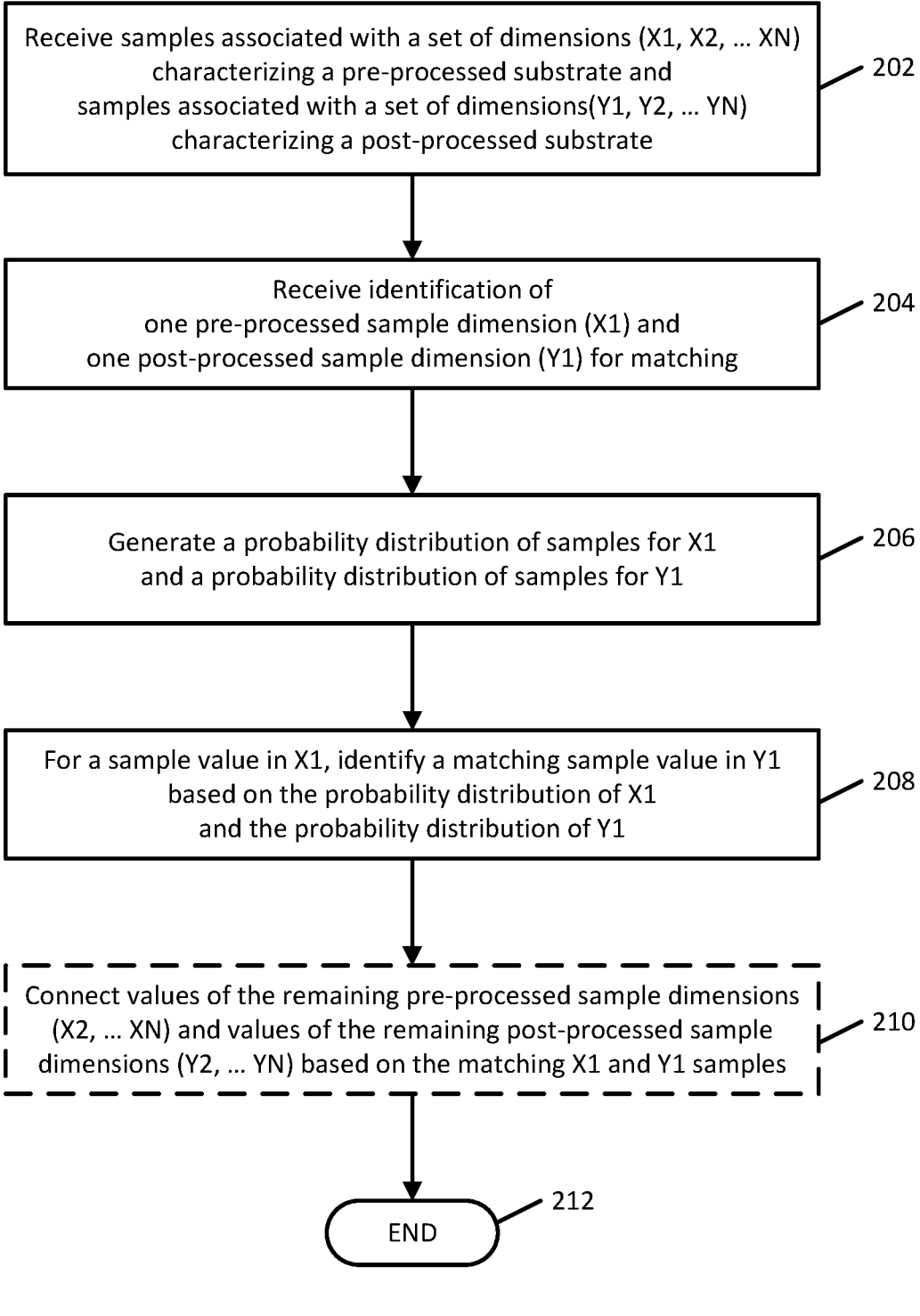

Receive samples associated with a set of dimensions (X1, X2, ... XN) characterizing a pre-processed substrate and samples associated with a set of dimensions(Y1, Y2, ... YN) characterizing a post-processed substrate ⟋ 202

Receive identification of one pre-processed sample dimension (X1) and one post-processed sample dimension (Y1) for matching ⟋ 204

Generate a probability distribution of samples for X1 and a probability distribution of samples for Y1 ⟋ 206

For a sample value in X1, identify a matching sample value in Y1 based on the probability distribution of X1 and the probability distribution of Y1 ⟋ 208

Connect values of the remaining pre-processed sample dimensions (X2, ... XN) and values of the remaining post-processed sample dimensions (Y2, ... YN) based on the matching X1 and Y1 samples ⟋ 210

END ⟋ 212

| | x1 | x2 | x3 |
|---|---|---|---|
| 0 | 1.764052 | 1.952367 | 0.815409 |
| 1 | 0.400157 | 0.265381 | 0.880310 |
| 2 | 0.978738 | 0.851689 | 1.549830 |
| 3 | 2.240893 | 2.337833 | 1.327632 |

304

| | y1 | y2 | y3 |
|---|---|---|---|
| 0 | -0.410267 | -0.490670 | 1.323148 |
| 1 | 0.624191 | 0.475209 | 0.787788 |
| 2 | 0.227300 | 0.628216 | 1.964925 |
| 3 | -0.035114 | -0.071126 | 2.302144 |

| Index | x1 | x2 | x3 | Probability | index | y1 | y2 | y3 | Probability |
|---|---|---|---|---|---|---|---|---|---|
| 0 | 1.76052 | 1.952367 | 0.815409 | 0.930693 | 332 | 0.608188 | 0.699785 | 1.033012 | 0.93014 |
| 1 | 0.400157 | 0.265381 | 0.88031 | 0.643564 | 224 | 0.100839 | -0.09708 | 2.69812 | 0.642715 |
| 2 | 0.978738 | 0.851689 | 1.54983 | 0.811881 | 273 | 0.354914 | -0.20738 | 1.594904 | 0.812375 |
| 3 | 2.240893 | 2.337833 | 1.327632 | 0.980198 | 27 | 0.818966 | 0.460435 | 2.3468 | 0.98004 |

Wafer population variation

Process variation

Overlapping Ion Path and Joint (Lower)

X1

Dimple volume

Y1

Ion that did not pass through joint

X1

Liner Loss Area

Y1

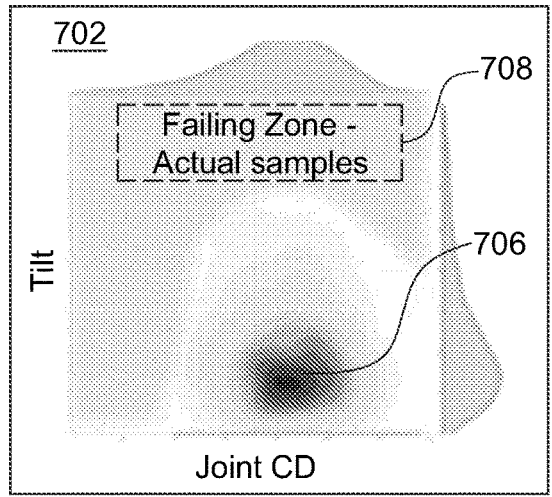
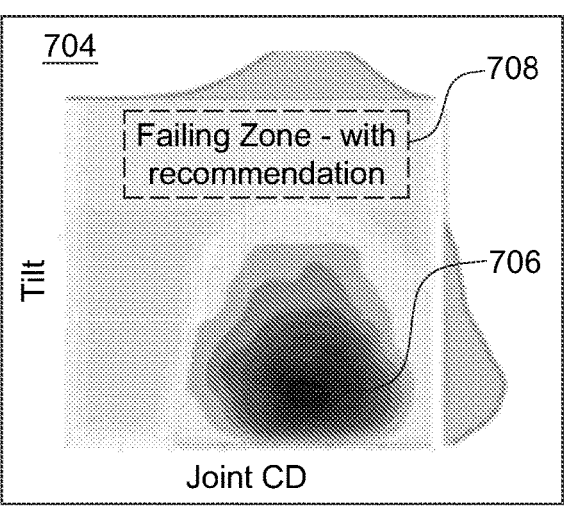
FIG. 7A
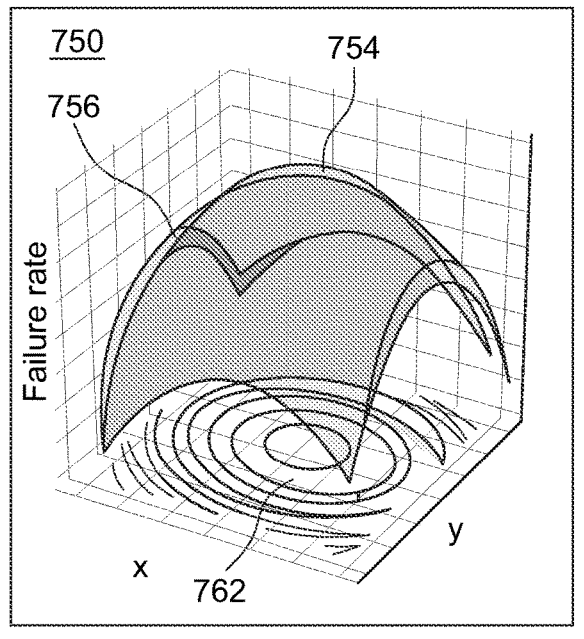
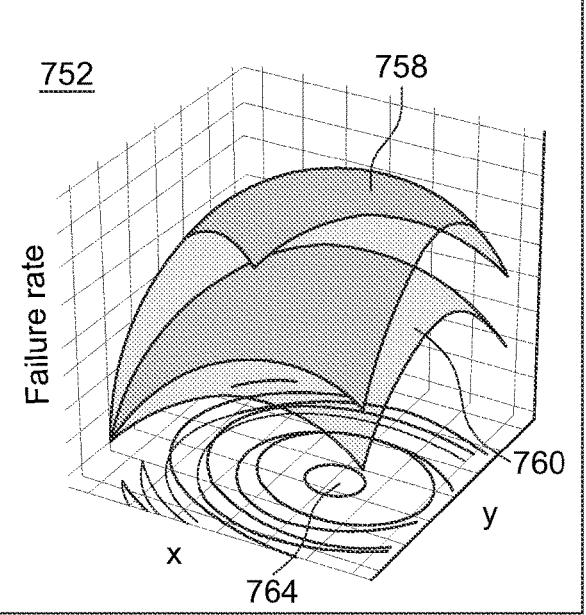
FIG. 7B

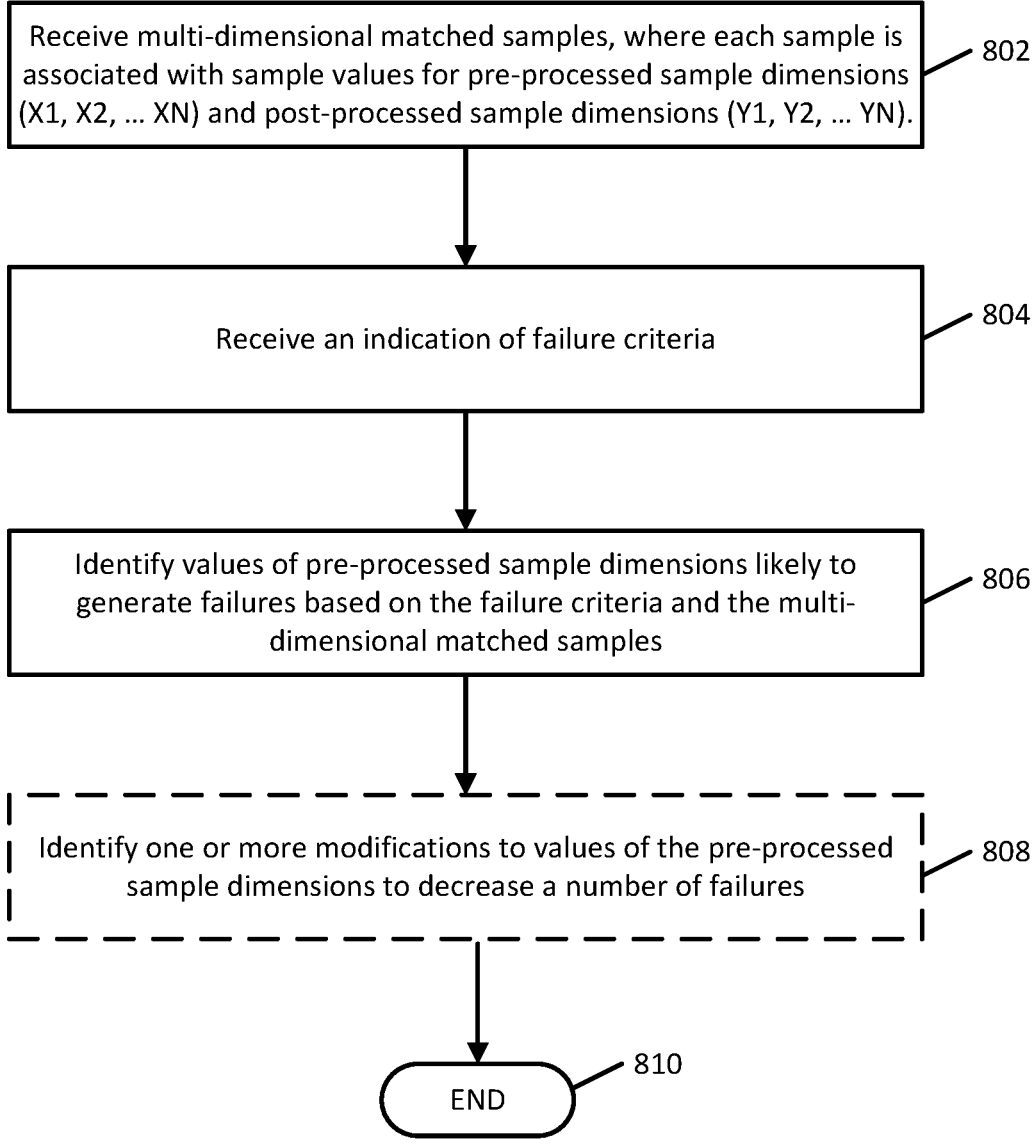

Receive multi-dimensional matched samples, where each sample is associated with sample values for pre-processed sample dimensions (X1, X2, ... XN) and post-processed sample dimensions (Y1, Y2, ... YN). — 802

Receive an indication of failure criteria — 804

Identify values of pre-processed sample dimensions likely to generate failures based on the failure criteria and the multi-dimensional matched samples — 806

Identify one or more modifications to values of the pre-processed sample dimensions to decrease a number of failures — 808

END — 810

MATCHING PRE-PROCESSING AND POST-PROCESSING SUBSTRATE SAMPLES

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Semiconductor device fabrication processes are often analyzed (e.g., by a process engineer who develops and/or maintains a process) using pre-processed and post-processed substrates, such as semiconductor wafers. For example, pre-processing and post-processing metrology data may be evaluated. However, these analyses tend to provide whole substrate summaries of substrate characteristics that include, for example, statistical representations (e.g., means, variances, etc.) of the pre-processed and post-processed substrates. It can be difficult to fully analyze a process using whole substrate summaries. For example, it can be difficult for a process engineer to decouple the effects of wafer variations on a pre-processed substrate from the effects of various process conditions.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor implicitly admitted as prior art against the present disclosure.

SUMMARY

Disclosed herein are systems, methods, and media for matching pre-processing and post-processing substrate samples.

In accordance with some embodiments, a computer program product for matching pre-processing substrate samples and post-processing substrate samples is provided, the computer program product comprising a non-transitory computer readable medium on which is provided computer-executable instructions for: receiving a plurality of samples associated with a first set of dimensions characterizing a pre-processed substrate and a plurality of samples associated with a second set of dimensions characterizing a post-processed substrate; receiving an identification of one of the pre-processed dimensions and one of the post-processed dimensions that are to be matched; generating a first probability distribution of samples for the identified pre-processed dimension and a second probability distribution of samples for the identified post-processed dimension; and matching samples of the identified pre-processed dimension to samples of the identified post-processed dimension based on the first probability distribution and the second probability distribution.

In some embodiments, the identification is based on finding a monotonic relationship between values of the one pre-processed dimension and the one post-processed dimension.

In some embodiments, the first probability distribution and the second probability distribution are each a cumulative distribution function, and wherein a value of the identified pre-processed dimension is matched to a value of the identified post-processed dimension based on the value of the identified pre-processed substrate having a substantially similar probability of occurrence as the value of the identified post-processed dimension in their respective cumulative distribution functions.

In some embodiments, the computer program product further comprises instructions for matching values of one or more remaining pre-processed dimensions with values of one or more remaining post-processed dimensions based on the matching samples of the identified pre-processed dimension and the identified post-processed dimension.

In some embodiments, the identified pre-processed dimension is a pre-processing Critical Dimension (CD) measurement.

In some embodiments, the identified post-processed dimension is a post-processing Critical Dimension (CD) measurement.

In some embodiments, values of the identified pre-processed dimension are generated using a model.

In some embodiments, the model is an ion confinement model that predicts a path of an ion used to etch two stacked substrate layers.

In some embodiments, the computer program product further comprises instructions for: determining, based on the ion confinement model, whether the ion passed through a joint at which the two substrate layers are stacked; and selecting the identified pre-processed dimension that is to be matched based on the determination of whether the ion passed through the joint.

In some embodiments, it is determined that the ion passed through the joint, and wherein the identified pre-processed dimension corresponds to a cross-sectional area that indicates an overlap between the path of the ion and the joint.

In some embodiments, the identified post-processed dimension corresponds to an etch volume on a bottom layer of the two substrate layers.

In some embodiments, it is determined that the ion did not pass through the joint, and wherein the identified pre-processed dimension corresponds to a cross-sectional area that indicates a difference between the path of the ion and the joint.

In some embodiments, the identified post-processed dimension corresponds to a liner loss area of a sidewall.

In accordance with some embodiments, a computer program product for evaluating semiconductor manufacturing processes is provided, the computer program product comprising a non-transitory computer-readable medium on which is provided computer-executable instructions for: receiving a dataset that comprises a first plurality of samples having pre-processing dimensions matched with a second plurality of samples having post-processing dimensions, wherein the first plurality of samples has been matched with the second plurality of samples based on a first probability distribution of sample values of one of the pre-processing dimensions and a second probability distribution of sample values of one of the post-processing dimensions; identifying a criterion for any given one of the post-processing dimensions that indicates a process failure based on values of the given post-processing dimensions relative to a threshold value; and identifying a potential cause for process failure based on values of a pre-processing dimension matched to the given post-processing dimension.

In some embodiments, values of the given post-processing dimension that exceed the threshold value indicate the process failure.

In some embodiments, the computer program product further comprises instructions for identifying a modification of values of the pre-processing dimension that generates values of the given post-processing dimension that are below the threshold value.

In some embodiments, the given post-processing dimension corresponds to a liner loss area of a side wall during etching of two stacked substrate layers.

In some embodiments, values of the given post-processing dimension that are below the threshold value indicate the process failure.

In some embodiments, the computer program product further comprises instructions for identifying a shift in values of the pre-processing dimension that generates values of the given post-processing dimension that exceed the threshold value.

In some embodiments, the given post-processing dimension corresponds to an etch volume during etching of two stacked substrate layers.

In some embodiments, the pre-processing dimension corresponds to a critical dimension (CD) of a joint at which the two substrate layers are stacked.

In some embodiments, the pre-processing dimension is an angle at which an ion passes through a top layer of the two stacked substrate layers to a bottom layer of the two stacked substrate layers.

In some embodiments, at least one of the one of the pre-processing dimensions and the one of the post-processing dimensions are generated by a computational model.

BRIEF DESCRIPTION OF THE DRAWINGS

FIG. 2 presents operations of a processor for matching pre-processing and post-processing substrate samples in accordance with some embodiments of the disclosed subject matter.

FIGS. 3A, 3B, and 3C show example data used for matching pre-processing and post-processing substrate samples in accordance with some embodiments of the disclosed subject matter.

FIGS. 7A and 7B show example graphs for identifying and mitigating failures of the etching process illustrated in FIG. 5A in accordance with some embodiments of the disclosed subject matter.

FIG. 8 presents operations of a processor for generating recommendations for process modifications in accordance with some embodiments of the disclosed subject matter.

DETAILED DESCRIPTION

Terminology

Figure 1:
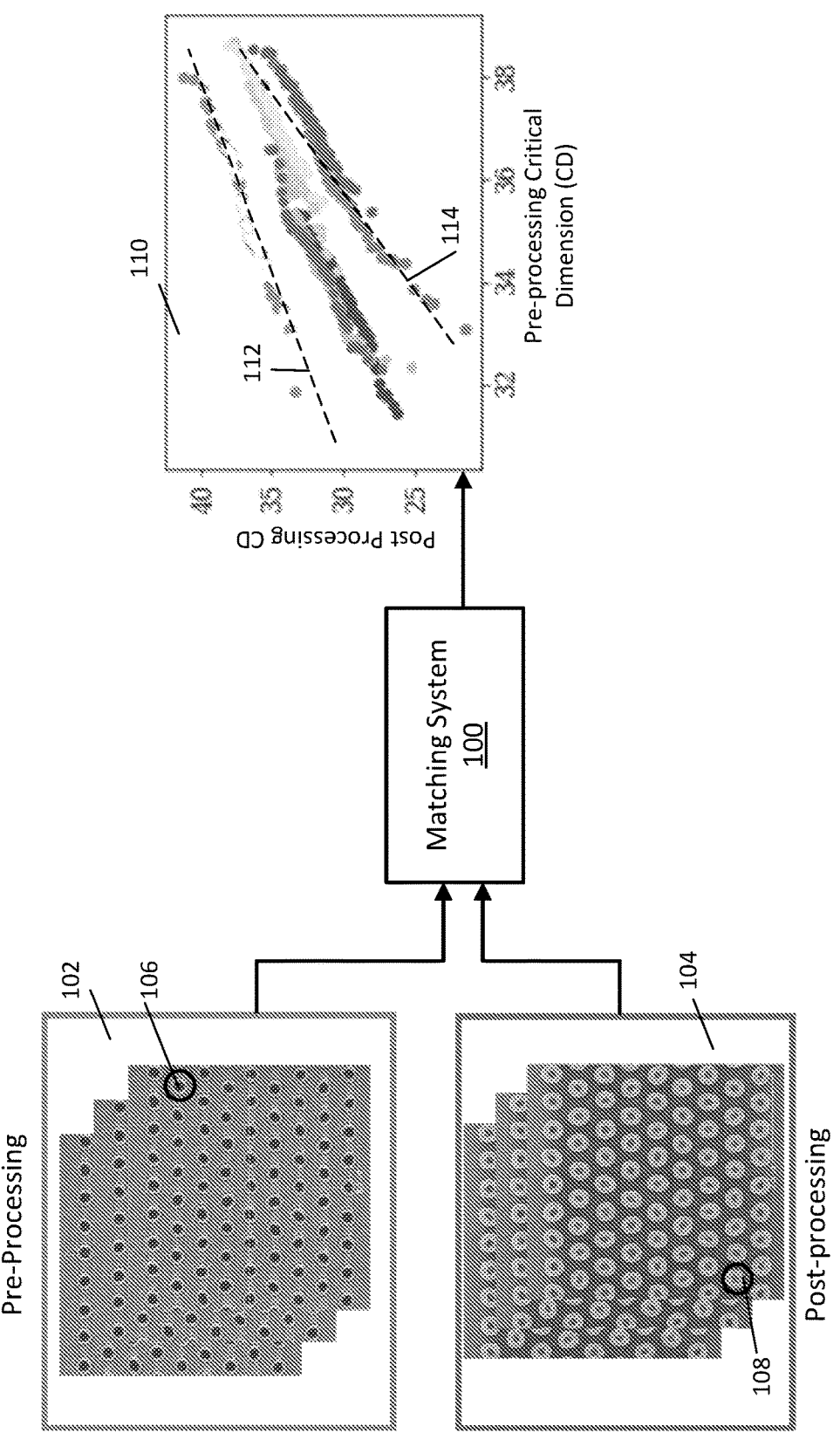
FIG. 1 presents a schematic diagram of use of a matching system configured to match pre-processing and post-processing substrate samples in accordance with some embodiments of the disclosed subject matter.

The following terms are used throughout the instant specification:

The terms "semiconductor wafer," "wafer," "substrate," "wafer substrate" and "partially fabricated integrated circuit" may be used interchangeably. Those of ordinary skill in the art understand that the term "partially fabricated integrated circuit" can refer to a semiconductor wafer during any of many stages of integrated circuit fabrication thereon. A wafer or substrate used in the semiconductor device industry typically has a diameter of 200 mm, or 300 mm, or 450 mm. Besides semiconductor wafers, other work pieces that may take advantage of the disclosed embodiments include various articles such as printed circuit boards, magnetic recording media, magnetic recording sensors, mirrors, optical elements, display devices or components such as backplanes for pixelated display devices, micro-mechanical devices and the like. The work piece may be of various shapes, sizes, and materials.

A "semiconductor device fabrication operation" as used herein is an operation performed during fabrication of semiconductor devices. Typically, the overall fabrication process includes multiple semiconductor device fabrication operations, each performed in its own semiconductor fabrication tool such as a plasma reactor, an electroplating cell, a chemical mechanical planarization tool, a wet etch tool, and the like. Categories of semiconductor device fabrication operations include subtractive processes, such as etch processes and planarization processes, and material additive processes, such as deposition processes (e.g., physical vapor deposition, chemical vapor deposition, atomic layer deposition, electrochemical deposition, electroless deposition). In the context of etch processes, a substrate etch process includes processes that etch a mask layer or, more generally, processes that etch any layer of material previously deposited on and/or otherwise residing on a substrate surface. Such an etch process may etch a stack of layers in the substrate.

"Manufacturing equipment" refers to equipment in which a manufacturing process takes place. Manufacturing equipment often has a process chamber in which the workpiece resides during processing. Typically, when in use, manufacturing equipment performs one or more semiconductor device fabrication operations. Examples of manufacturing equipment for semiconductor device fabrication include deposition reactors such as electroplating cells, physical vapor deposition reactors, chemical vapor deposition reactors, and atomic layer deposition reactors, and subtractive process reactors such as dry etch reactors (e.g., chemical and/or physical etch reactors), wet etch reactors, and ashers.

"Metrology data" as used herein refers to data produced, at least in part, by measuring features of a processed substrate. Metrology measurements may be made before or after performing the semiconductor device manufacturing operation.

In some embodiments, metrology data is produced by a metrology system performing microscopy (e.g., scanning electron microscopy (SEM), transmission electron microscopy (TEM), scanning transmission electron microscopy (STEM), reflection electron microscopy (REM), atomic force microscopy (AFM)) or optical metrology on the etched substrate. In some embodiments, the metrology data is produced by performing reflectometry, dome scatterometry, angle-resolved scatterometry, small-angle X-ray scatterometry and/or ellipsometry on a processed substrate. In some embodiments, the metrology data include spectroscopy data from, e.g., energy dispersive X-ray spectroscopy (EDX). In some cases, optical metrology is performed using a stand-alone or integrated optical metrology tool configured to accurately characterize one or more properties of a fabricated or partially fabricated electronic device. Such optical metrology tools may be configured to produce a small beam spot (e.g., about 5 mm or smaller diameter) on a substrate surface. In some embodiments, the metrology data can include Optical Critical Dimension (OCD) information corresponding to a feature. As a specific example, in some embodiments, the OCD information can indicate an etch depth.

A metrology system may obtain information about dimensions (e.g., size, depth, width, area, etc.) of various features, such as edges, vias, trenches, pillars, etc. Additionally, a metrology system may obtain information relating to potential defects or failures during fabrication, such as an amount or area of a protective liner (e.g., a liner of a sidewall) that is etched away during an etching process. A metrology system may obtain information about materials contained in a substrate or a layer on a substrate. Such information may include optical information (e.g., extinction coefficient and/ or refractive index), chemical information (e.g., chemical composition and/or atomic composition), morphological information such as crystal structure, and the like.

Note that, in some embodiments, metrology can be destructive. For example, in some embodiments, metrology measurements obtained using a SEM system may involve a delayering process where a top layer is removed prior to obtaining the metrology measurements.

Additionally, note that, metrology data can be collected prior to substrate processing and/or post-processing.

A "cumulative distribution function," or CDF, as referred to herein describes a function that indicates a probability that a variable X will take a value less than or equal to x. That is, for a variable X, CDF(x)=P(X<=x).

In some embodiments, a CDF can be empirically created based on measured values or observations of a variable. For example, an empirically created CDF can be a histogram that indicates, for a particular value x of a variable X, the frequency of observations that are less than or equal to x.

A "sample" as referred to herein refers to a metrology measurement that contains information about any of a number of different substrate surface characteristics. For example, a sample taken on a pre-processed wafer may include the critical dimension of a feature, the depth of the feature, the sidewall angle of the feature, one or more optical properties of a film on the feature, a chemical composition of a structure with a feature, and the like. Similarly, a sample taken on the post-processed substrate may include the same or a different set of surface characteristics of a given feature on the post-processed substrate. Each of these characteristics may be considered a dimension of the sample. In some discussion herein, samples on pre-processed substrates are represented by X and samples on post-processed substrates are represented by Y. Each of the X samples has dimensions, X1, X2, . . . XN, each representing a different pre-processed substrate characteristic such as CD, depth, etc. Similarly, each of the Y samples has dimensions Y1, Y2, . . . YM, each also representing a different post-processed substrate characteristic.

It should be noted that the notation X1, X2, . . . XN and Y1, Y2, . . . YM is used herein to represent a set of pre-processing dimensions and a set of post-processing dimensions, respectively, and should be considered to include the cases where N is 1 or 2. For example, a set of pre-processing dimensions (which is generally referred to herein as X1, X2, . . . XN) may only have one dimension, X1, or may have two dimensions, X1 and X2. As another example, a set of post-processing dimensions (which is generally referred to herein as Y1, Y2, . . . YM) may only have one dimension, Y1, or may have two dimensions, Y1 and Y2. Additionally, it should be noted that the notation X1, X2, . . . XN and Y1, Y2, . . . YM should be considered to include the case where there is a different number of pre-processing dimensions than post-processing dimensions. For example, the set of pre-processing dimensions may be X1, and the set of post-processing dimensions may be Y1 and Y2. As another example, the set of pre-processing dimensions may be X1 and X2, and the set of post-processing dimensions may be Y1, Y2, and Y3.

Additionally, it should be noted that, in some embodiments, a dimension X1 and a dimension Y1 may be pre-processing and post-processing values of the same dimension. For example, in some embodiments, X1 may be a pre-processing CD and Y1 may be a post-processing CD. Conversely, in some embodiments, a dimension X1 and a dimension Y1 may be different dimensions. For example, in some embodiments, X1 may be CD and Y1 may be depth.

Note that, in some embodiments, a sample may not include values for every dimension. For example, a first sample may include values for pre-processing dimensions X1, X2, . . . XN. However, a second sample may be missing a value for a particular pre-processing dimension, such as X1, X2, etc.

Additionally, note that, in some embodiments, values for a particular dimension may be values generated or calculated using a model, equation(s), or other computational representation of a physical system.

A "matching system" as described herein refers to a computational system configured to match a pre-processing substrate sample with a post-processing substrate sample. For example, a matching system can be configured to match a sample j that has a particular value for a pre-processing sample dimension X1 with a sample k that has a particular value for a post-processing sample dimension Y1.

As a more particular example, sample j can be associated with measurements for pre-processing sample dimensions X1, X2, . . . XN. Continuing with this example, sample k can be associated with measurements for post-processing sample dimensions Y1, Y2, . . . YM. The matching system can be configured to match sample j with sample k based on values of X1 and Y1, respectively. For example, sample j and sample k can be matched based on a probability distribution of X1 and a probability distribution of Y1. In some embodiments, by matching values of X1 and Y1, the matching system can additionally connect the values of the other pre-processing sample dimensions X2, . . . XN for sample j with values of the other post-processing sample dimensions Y2, YM for sample k.

Overview

In some conventional analyses of semiconductor device fabrication processes, pre-processed and post-processed substrates (e.g., semiconductor wafers and/or test structures) are evaluated and characterized. The evaluations may comprise metrology measurements using any of a number of metrology techniques such as electron microscopy, chemical analyses (e.g., emission spectroscopy), optical metrology, etc. In some embodiments, the metrology technique is a "top-down" process such as Critical Dimension Scanning Electron Microscopy (CDSEM). The metrology measurements may provide information about substrates and features formed on the substrates. Such information may include geometric information (e.g., critical dimensions, widths, sidewall angles, pitches of features on the substrate), optical information (e.g., extinction coefficients and refractive indices of films on the substrate), chemical information (e.g., the chemical composition of layers on the substrate), etc.

The characterizations of the pre-processed and post-processed substrates may include statistical representations of metrology measurements made on the respective substrates. The statistical representations may include, for example, central tendencies (e.g., means), variances, and/or other properties of a distribution of measured characteristics on the pre-processed and post-processed substrates.

Unfortunately, these existing approaches merely provide whole substrate summaries of the substrate characteristics. They do not match substrate characteristics in the pre-processed and post-processed substrates on a point-by-point basis. For example, they do not match substrate characteristics for a given feature or location on the pre- and post-processed substrate. In other words, these techniques do not provide a one-to-one matching of pre-processed and post-processed substrate surface characteristics.

As a consequence, much information that would be valuable to process designers and other personnel charged with developing, maintaining, and/or modifying processes are not available. For example, the existing approach makes it difficult or impossible to decouple the effects of incoming wafer variations (e.g., some features are deeper than other features on a given pre-processed substrate) and process conditions. In other words, the observed conditions on a post-processed substrate may be a result of the substrate conditions of the pre-processed wafer and/or one or more process conditions employed while processing the substrate, but existing methodologies do not isolate these effects. Without knowing how a given feature on the pre-processed substrate maps to that same feature on the post-processed substrate, after modification via the process under consideration, it is essentially impossible to discern the impact of point-to-point variations on the surface of the pre-processed substrate.

In certain embodiments, sample points from pre-processed and post-processed substrates are matched without requiring that the metrology measurements of the pre-processed and post-processed substrates be measured at the same locations.

To understand how this process works, understand that each of the pre-processed and post-processed substrates are evaluated by a series of samples (e.g., a series of metrology measurements taken at distinct locations on the substrates). Each sample is a separate metrology measurement, such as a separate CDSEM measurement, at a location on a substrate.

Each sample is a metrology measurement that contains information about any of a number of different substrate surface characteristics. For example, a sample taken on a pre-processed wafer may include the critical dimension (CD) of a feature, the depth of the feature, the sidewall angle of the feature, one or more optical properties of a film on the feature, a chemical composition of a structure with a feature, and the like. Similarly, a sample taken on the post-processed substrate may include the same or a different set of surface characteristics of a given feature on the post-processed substrate. Each of these characteristics may be considered a dimension of the sample. In some discussion herein, samples on pre-processed substrates are represented by X and samples on post-processed substrates are represented by Y. Each of the X samples has dimensions, $X1, X2, \ldots XN$, each representing a different pre-processed substrate characteristic such as CD, depth, etc. Similarly, each of the Y samples has dimensions $Y1, Y2, YM$, each also representing a different post-processed substrate characteristic.

Note that the metrology information need not be limited to a single feature, but rather it may include information from a collection of neighboring features. An example is an optical signal taken from a regularly repeating structure on a memory cell, where the regularly repeating feature serves as a diffraction grating producing signals that may be measured and analyzed using optical metrology.

In some implementations, samples from the pre-processed substrate are matched to samples from the post-processed substrate. The matching may be based on criteria that causes individual samples from pre-processed substrates to be matched for the same or similar samples from post-processed samples.

In some embodiments, the process described here analyzes the sample data of the pre-processed substrate and of the post-processed substrate to identify dimensions of those samples that vary monotonically with each other. That is, a pre-processing sample dimension (referred to herein as X1) and a post-processing sample dimension (referred to herein as Y1) are identified such that sample values of Y1 are a monotonic consequence of sample values of X1. A specific example of X1 is a top CD of a high aspect ratio hole before an etching process has been performed, and Y1 is an etch depth after the etching process has been performed. The dimensions are provided in the form of a histogram that plots abundance as a function of values of the dimension under consideration. Such a histogram may be provided as a cumulative distribution function corresponding to a probability density function for the dimension under consideration.

After identifying and selecting a dimension (X1) from the samples of the pre-processed wafer and a corresponding dimension (Y1) from the post-processed substrate samples such that X1 and Y1 meet the monotonicity requirement, sample values corresponding to these two dimensions are matched. The matching may be accomplished by identifying the values of the X1 and Y1 dimensions from the pre-processed and post-processed substrate samples having the same or substantially similar relative abundance value in the cumulative distribution function.

Based on the matched sample values, pairs of pre-processing and post-processing samples can be matched. Once pairs of pre-processing and post-processing samples are matched, other pre- and post-processing dimensions of the matched samples (e.g., X2, Y2, X3, Y3, etc.) can likewise be connected based on these pairings. With this information, the full set of dimensions of all samples in the pre-processed substrate in the post-processed substrate are now matched with or connected to one another.

With this information, one can determine how individual features, having different characteristics, on a pre-processed substrate influence the corresponding features in the post-processed substrate. Similarly, one can see the impact of process variations on individual features of the substrate. In other words, this abundance matching approach allows one to decouple the impact of feature variations on the pre-processed wafer from process condition variations. Furthermore, by identifying impacts of process variations on individual features of the substrate, a process engineer can identify modifications to a process that will produce particular feature characteristics.

Some embodiments employ a model or other representation of a physical process in lieu of, or in conjunction with, metrology measurements to generate dimensions X1, X2, . . . XN for preprocessed substrate samples. Similarly, some embodiments employ a model or other representation of a physical process in lieu of, or in conjunction with, metrology measurements to generate dimensions Y1, Y2, . . . . YM for postprocessed substrate samples. For example, an ion confinement model may calculate ion flux to a particular area or volume of a feature given that feature's position on the substrate and/or geometric configuration. When using a model or other representation of a physical process in lieu of a metrology measurement, matching may nevertheless be performed as described above.

Matching Pre-Processing and Post-Processing Substrate Samples

Pre-processing substrate samples and post-processing substrate samples can be matched such that pre-processing substrate features and post-processing substrate features are matched on a one-to-one basis.

Samples associated with a set of pre-processing dimensions X1, X2, . . . XN characterizing a pre-processed substrate can be received. In some embodiments, each sample can be associated with a particular metrology measurement, such as a CDSEM measurement. Each dimension is a different type of pre-processing feature characteristic, such as a CD of a feature prior to processing. Similarly, samples associated with a set of post-processing dimensions Y1, Y2, . . . YM characterizing a post-processed substrate can be received, where each dimension is a different type of post-processing feature characteristic, such as a CD of a feature on a substrate after processing, an etch depth, area, or volume after an etching process has been performed, an area of a protective liner that has been etched away after an etching process, an amount of distortion that indicates a degree of twisting of a hole-type feature, etc.

A pre-processing dimension X1 and a post-processing dimension Y1 can be identified, where the identified X1 and Y1 correspond to dimensions for which sample values are to be matched. X1 and Y1 can be identified such that Y1 is a monotonic consequence of X1. A specific example is where X1 corresponds to a CD of a trench opening and Y1 corresponds to a depth of the trench after an etching process has been performed.

A probability distribution corresponding to sample values of the pre-processing dimension X1 and a probability distribution corresponding to sample values of the post-processing dimension Y1 can be generated. For example, each probability distribution can be a cumulative distribution function (CDF). As a more particular example, $CDF(x)$ for X1 can indicate a probability P that a sample value $x_j$ drawn from X1 is less than a value x. Similarly, $CDF(y)$ for Y1 can indicate a probability P that a sample value $y_k$ drawn from Y1 is less than a value y. Note that although the examples described herein generally use a cumulative distribution function, other types of probability functions may be used, such as a complementary cumulative distribution function or tail distribution, a quantile function, etc.

The received samples can be matched based on the probability distribution of X1 and the probability distribution of Y1. In particular, a sample having a particular probability value in the probability distribution of X1 can be matched to a sample having a substantially similar or the same probability value in the probability distribution of Y1.

That is, samples are matched based on respective values for X1 and Y1 dimensions having similar or the same abundances in the density distribution of X1 and Y1, where the abundances are indicated in the CDF of X1 and the CDF of Y1, respectively.

Matched samples can be analyzed to determine the sensitivity of a process that generated the samples and/or the process margin of the process that generated the samples. For example, for a particular process, such as a particular etching process, the matched samples can indicate how sensitive a particular post-processing dimension is to variations in values of the pre-processing dimensions.

FIG. 1 illustrates a matching system that is configured to receive pre-processing substrate metrology samples 102 and post-processing substrate metrology samples 104. Pre-processing substrate metrology samples 102 correspond to a pre-processing CD measurement, and post-processing substrate metrology samples 104 correspond to a post-processing CD measurement. Note that, pre-processing substrate metrology samples 102 may be collected from the same locations or from different locations relative to post-processing substrate metrology samples 104. For example, as illustrated in FIG. 1, pre-processing substrate metrology samples may be collected from locations including a pre-processing location 106. Continuing with this example, post-processing substrate metrology samples may be collected from locations including post-processing location 108.

Matching system 100 is configured to match pre-processing substrate metrology samples 102 and post-processing substrate metrology samples 104 to generate matched samples as shown in graph 110. In effect, the matched samples indicate an effect of values of pre-processing substrate metrology samples 102 on values of post-processing substrate metrology samples 104. For example, as shown in FIG. 1, the matched samples indicate an effect of the pre-processing CD measurement on the post-processing CD measurement.

Graph 110 shows a relationship of post-processing CD to pre-processing CD for a variety of different processes, where pre-processing samples and post-processing samples for each process have been matched. For each process shown in graph 110, the relationship between post-processing CD and pre-processing CD can be considered linear and can be expressed with a slope. The slope indicates a process margin or a process sensitivity of the process. For example, slope 112 is shallower than slope 114, indicating that a process corresponding to slope 112 is less sensitive to variations in pre-processing CD than the process corresponding to slope 114.

Turning to FIG. 2, a flowchart that shows operations for matching pre-processing and post-processing substrate samples that can be performed by a processor is shown in accordance with some embodiments of the disclosed subject matter.

At 202, pre-processing samples associated with a set of pre-processing dimensions X1, X2, . . . XN and post-processing samples associated with a set of post-processing dimensions Y1, Y2, . . . YM can be received.

Each sample can correspond to a set of measurements or values at a particular location of a wafer prior to processing (in the case of pre-processing samples) or post-processing (in the case of post-processing samples). In some embodiments, a measurement or value can be a metrology measurement that is measured using any suitable metrology system (e.g., CDSEM, XSEM, HVSEM, etc.). For example, a metrology measurement can be a CD of a particular line, edge, trench, via, hole, pillar, etc. In some embodiments, a value can be a calculation derived from an equation, a set of equations, or a model, as is described in more detail in connection with FIGS. 5A, 5B, and 5C.

Each dimension can represent a different characteristic of a feature. Dimensions corresponding to feature characteristics can include pre-processing CDs, post-processing CDs, etch depths, etch volumes, an amount or area of a protective liner that has been etched away during an etching process, tilt (e.g., structure tilt of a high aspect ratio structure or feature prior to etching), etc.

Note that a minimum number of pre-processing samples and/or post-processing samples may be required to perform the matching technique(s) shown in and described below in connection with blocks 204-210. For example, the matching technique may require enough samples to determine that values of various dimensions satisfy particular criteria, such as that the sample distribution is stationary, etc. In some embodiments, an expected sample variance, such as Poisson variance, may be calculated to determine if a derived CDF of a sample is likely to be stable. In some embodiments, the process can terminate in response to determining that a minimum number of samples required have not been received at block 202.

Figure 3A:
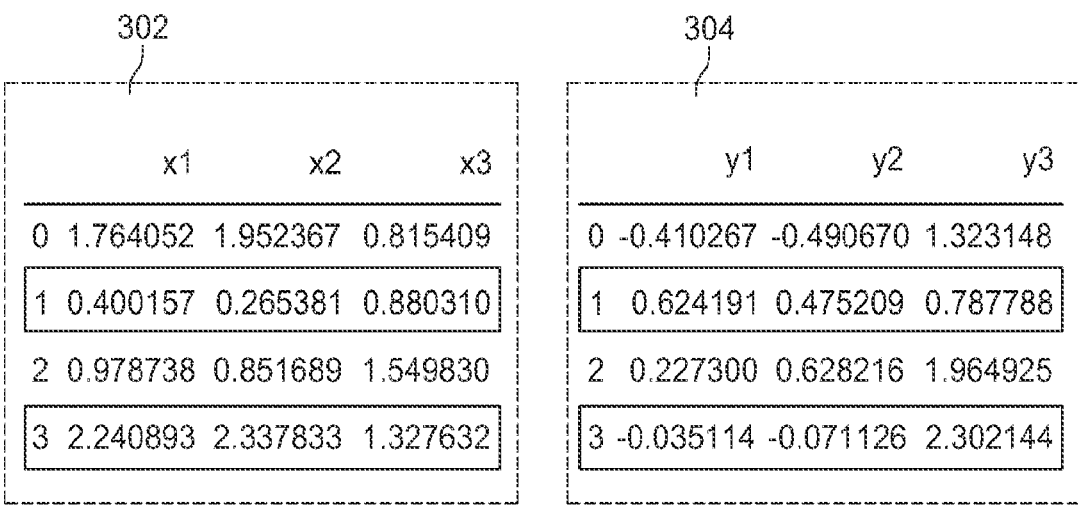

FIG. 3A shows an example table that shows values associated with different pre-processing dimensions and post-processing dimensions for a group of samples in accordance with some embodiments of the disclosed subject matter.

Table 302 shows values for four samples (0, 1, 2, and 3) for three pre-processing dimensions (X1, X2, and X3). Table 304 shows values for four samples (0, 1, 2, and 3) for three post-processing dimensions (Y1, Y2, and Y3). Note that, although tables 302 and 304 each show four samples that are labeled 0, 1, 2, and 3, the four samples shown in tables 302 and 304 do not necessarily correspond to each other. For example, sample 0 in table 302 does not necessarily have any relation to sample 0 in table 304.

Referring back to FIG. 2, at 204, an identification of one pre-processed sample dimension and one post-processed sample dimension to be used for matching is received. Note that the identified pre-processed sample dimension is referred to herein as "X1," and the identified post-processed sample dimension is referred to herein as "Y1."

In some embodiments, X1 and Y1 can be required to satisfy any suitable criteria. For example, in some embodiments, a distribution of values of X1 and Y1 can be required to be stationary. As another example, in some embodiments, values of Y1 can be required to have a monotonic relationship with X1. That is, in some embodiments, observations of Y1 can be a consequence of X1 with a monotonic relationship. Note that X1 and Y1 need not have similar distribution characteristics, span similar ranges, or have other relatedness other than having a monotonic relationship and being stationary.

As a specific example, X1 can be a CD of an opening prior to an etching process, and Y1 can be an etch depth after the etching process. As another specific example, X1 can be a CD of a feature prior to processing, and Y1 can be a CD of the feature post-processing. Additional specific examples are shown in and described below in connection with FIGS. 5A, 5B, and 5C.

In some embodiments, X1 and Y1 can be identified manually, for example, by a process engineer. Alternatively, in some embodiments, X1 and Y1 can be identified algorithmically. For example, X1 and Y1 can be identified algorithmically as dimensions that have values that satisfy the criteria described above.

At 206, a probability distribution of samples for X1 and a probability distribution of samples for Y1 can be generated.

For example, in some embodiments, each probability distribution can be represented as a histogram that indicates a frequency of samples being less than or equal to a particular value. Accordingly, such a probability distribution can be considered a cumulative distribution function that corresponds to an area under a probability density function of each dimension.

Note that although the examples discussed herein use a cumulative distribution function, in some embodiments, other types of probability distributions can be used. For example, a complementary cumulative distribution function or tail distribution that indicates a probability that a sample exceeds a particular value can be used. As another example, an inverse cumulative distribution function or a quantile function that indicates the sample value that maps to a particular probability in a cumulative distribution function can be used.

Figure 3B:
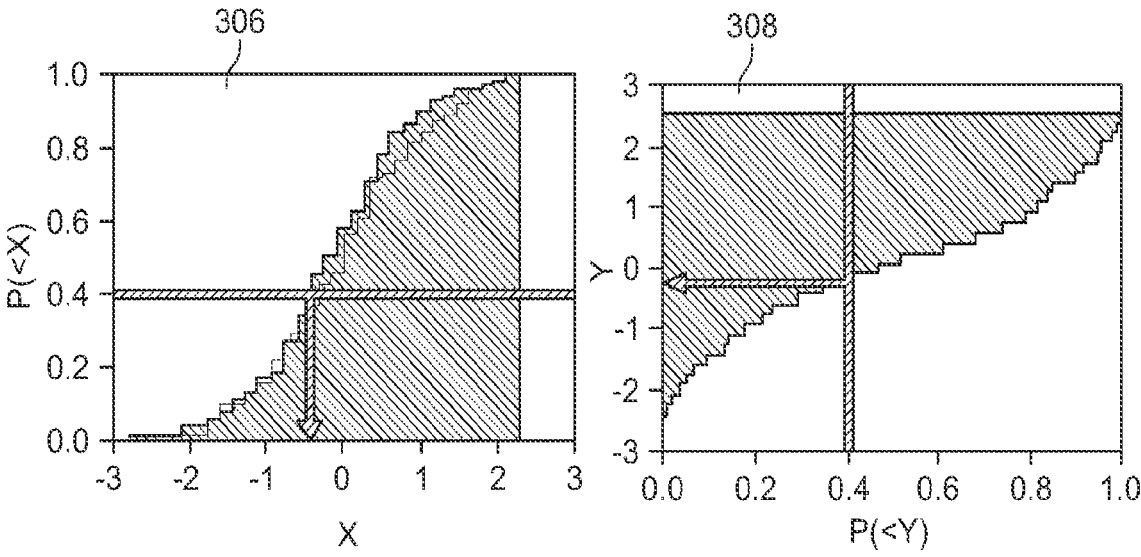

As a more particular example, FIG. 3B, depicts an exemplary X1 histogram 306 and an exemplary Y1 histogram 308. As illustrated, X1 histogram 306 shows the probability that a sample value from X1 will be less than a given value x of X1. Similarly, Y1 histogram 308 shows the probability that a sample value from Y1 will be less than a given value y of Y1.

Referring back to FIG. 2, at 208, for an X1 sample value, a matching Y1 sample value can be identified based on the probability distribution of X1 and the probability distribution of Y1. That is, the sample values can be matched based on having the same or substantially similar abundances in their respective cumulative distribution functions.

For example, turning back to FIG. 3B, referring to X1 histogram 306, the value x of X1 for which $P(X1<x)=0.4$ is roughly −0.4. Accordingly, the sample j for which a value of X1 is −0.4 can be matched to a sample k from the Y1 distribution for which $P(Y1<y)=0.4$. Referring to Y1 histogram 308, a matching sample k can be identified as a sample k having a value of roughly −0.2.

Referring back to FIG. 2, in some embodiments, when pre-processing substrate samples are matched with post-processing substrate samples, a probability that a pre-processing substrate sample matches a particular post-processing substrate sample can be calculated. For example, a probability that a sample j associated with dimension X1 matches a sample k associated with dimension Y1 can be calculated. In some embodiments, match probabilities can be calculated for multiple potential samples, and matching samples can be identified based on the highest matching probabilities. For example, for a particular sample j, probabilities that j matches samples k1, k2, and k3 can be calculated. Continuing with this example, sample j can be matched to one k1, k2, and k3 based on the highest matching probability assigned to each of k1, k2, and k3.

It should be noted that a probability that a sample j matches a sample k can be calculated, and, a corresponding probability that sample k matches sample j can additionally be calculated. In general, the two probabilities can be substantially similar or the same. In some instances, a substantial difference in the two probabilities may indicate that a sample size used to construct underlying CDFs is not large enough and/or that the underlying samples are not stationary.

At 210, sample values of the remaining pre-processing sample dimensions X2, . . . XN and sample values of the remaining post-processing sample dimensions Y2, . . . YM can be connected based on the matched sample values matched for X1 and Y1. Note that, in some embodiments, block 210 can be omitted.

FIG. 3C depicts an example table with samples matched across all dimensions.

As illustrated in row 310, pre-processing sample index 0 has been matched with post-processing sample index 332. In this example, pre-processing sample index 0 has been matched with post-processing sample index 332 based on probability distributions of X1 and Y1. That is, pre-processing sample index 0 has been matched with post-processing sample index 332 based on the cumulative distribution probability value of $P(X1=1.76)=0.93$ matching the cumulative distribution probability value of $P(Y1=0.61)=0.93$. Note that the match of pre-processing sample index 0 to post-processing sample index 332 has been assigned a probability of 0.931. Similarly, the match of post-processing sample index 332 to pre-processing sample index 0 has been assigned a probability of 0.93.

Additionally, note that with respect to row 310, sample values for X2, X3, Y2, and Y3 are included in the table to illustrate that after matching pre-processing sample index 0 to post-processing sample index 332, values of X2, X3, Y2, and Y3 can likewise by connected. In other words, by matching samples using the X1 and Y1 dimensions, the X2, X3, Y2, and Y3 dimensions can be connected merely by being associated with the samples matched using the X1 and Y1 dimensions, even if distributions of the X2, X3, Y2, and Y3 dimensions do not satisfy the criteria described above in connection with block 204.

Referring back to FIG. 2, the process can end at 212.

After connecting the remaining pre-processing sample dimensions and the remaining post-processing sample dimensions, a multi-dimensional dataset of matched samples has been created. This dataset can be used for many purposes, such as isolating and identifying an effect of a particular pre-processing dimension on a particular post-processing dimension, identifying values of particular pre-processing dimensions that are likely to cause failures or defects as indicated by particular values of post-processing dimensions, identifying changes to values of pre-processing dimensions that can mitigate process failures, etc. Use of the multi-dimensional dataset is shown in and described below in connection with FIG. 8.

Additionally, in some cases, a dataset of matched samples may be missing values for some samples and/or some dimensions. In some cases, relationships between a pre-processing dimension and a post-processing dimension can be used to interpolate or extrapolate missing values. For example, in a case where the dataset of matched samples indicates that a relationship between a pre-processing dimension X1 and a post-processing dimension can be considered linear, a missing value for Y1 for a particular sample can be calculated based on the linear relationship and based on a known or measured value for X1 for the sample. Conversely, a missing value for X1 can be calculated in a similar manner.

Figure 4A:
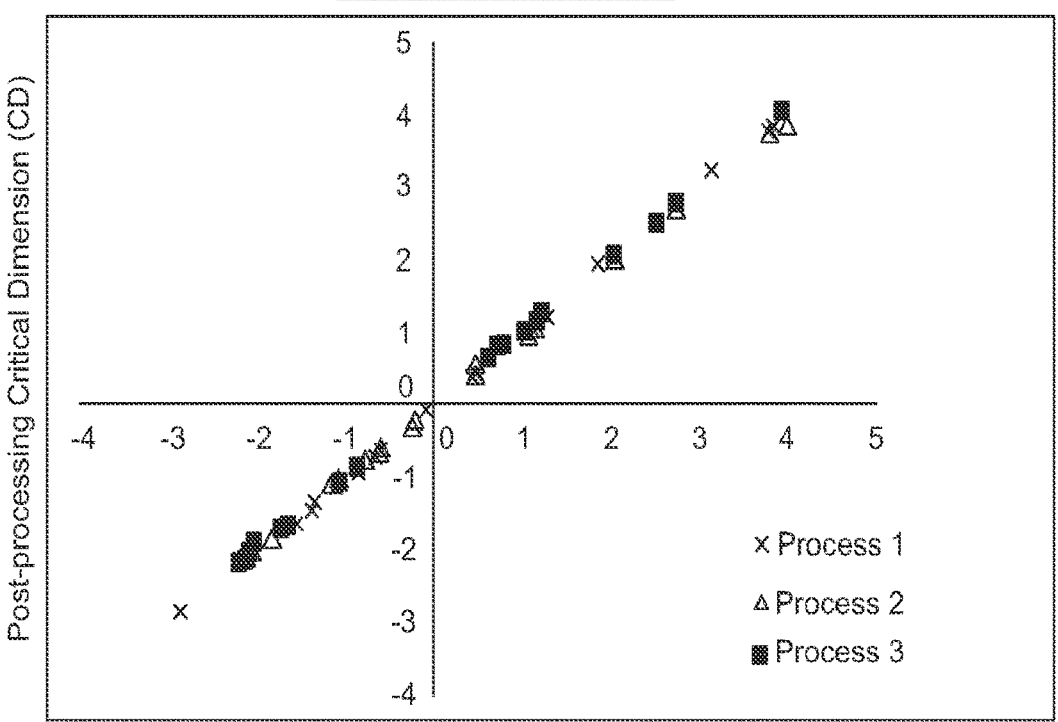
FIGS. 4A and 4B show graphs that illustrate a decoupling of wafer variation from process variation as a result of matching pre-processing and post-processing substrate samples in accordance with some embodiments of the disclosed subject matter.
Figure 4B:
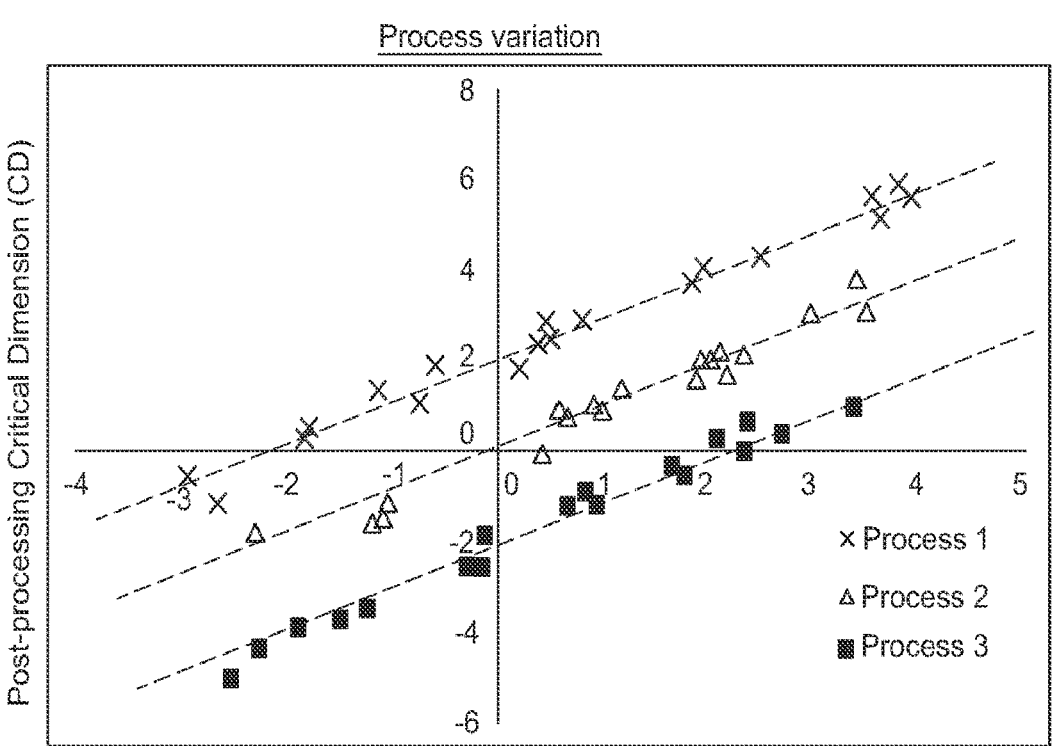

Turning to FIGS. 4A and 4B, graphs that illustrate how matching pre-processing samples and post-processing samples as described above can decouple wafer variation from process variation are shown in accordance with some embodiments of the disclosed subject matter.

FIG. 4A shows a graph of post-processing CD as a function of pre-processing CD for three processes (Process 1, Process 2, and Process 3), where the three processes are the same, but for which there is underlying wafer population variation (e.g., due to sampling differences and/or due to underlying differences in substrate surfaces prior to processing). After sample matching (e.g., using the techniques described above in connection with FIG. 2), the relationship of post-processing CD to pre-processing CD is the same for all three processes, which is to be expected with no process variation. This shows that the sample matching technique can correctly match pre-processing substrate samples with post-processing substrate samples, despite underlying wafer population variation when there is no process variation.

Conversely, referring to FIG. 4B, in an instance in which the three processes are different (e.g., use different setpoints, use different recipes, etc.), after matching pre-processing samples and post-processing samples, the three processes can be clearly distinguished.

Note that the slope of different processes as shown in FIG. 4B can indicate a sensitivity of a process or a process margin of the process. For example, a process that has a steeper slope can be said to be more sensitive (or has a smaller process margin) than a process that has a shallower slope.

Two-Tier Stacked Etching Process

FIGS. 5A, 5B, 5C, 6, 7A, and 7B illustrate techniques and data for matching pre-processing and post-processing samples using the matching technique described above in connection with FIG. 2 with respect to a two-tier, stacked etching process. In particular, ions are used to etch a "dimple" in a bottom layer that is stacked on the top layer, where the top layer and the bottom layer are stacked prior to the etching process. Note that the point at which the top layer and the bottom layer are stacked is referred to herein as a "joint."

Figure 5A:
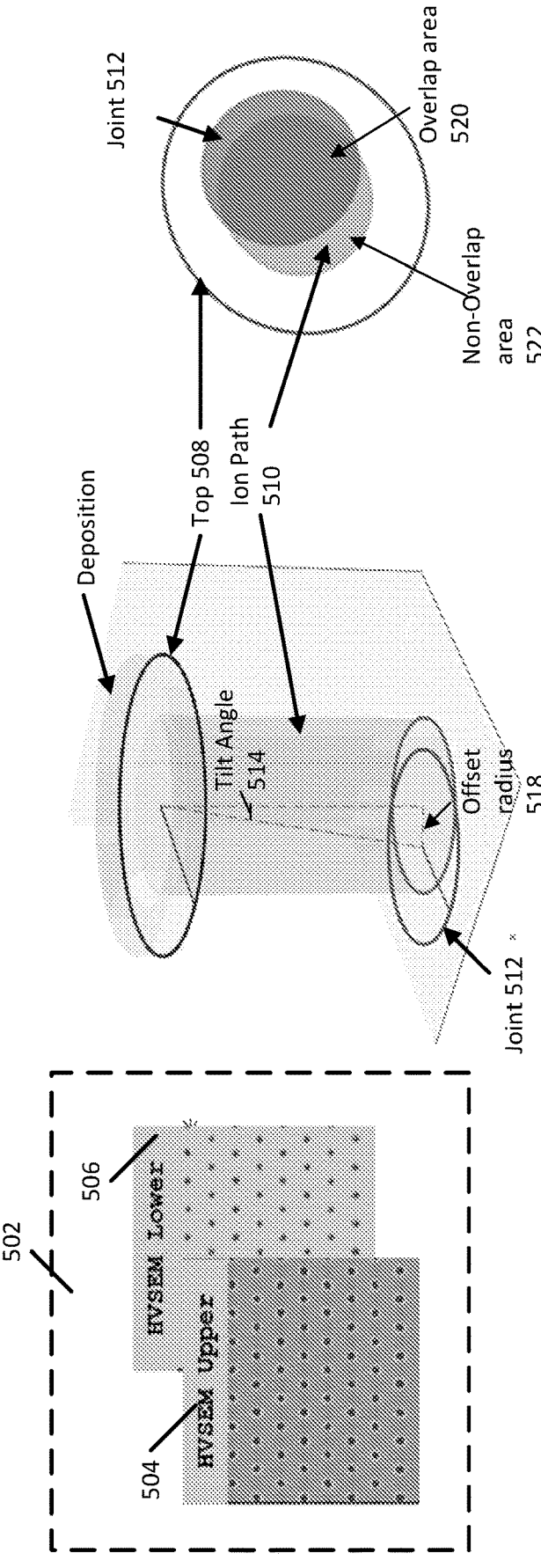
FIG. 5A shows a schematic diagram of a two-tier stacked layer etching process in accordance with some embodiments of the disclosed subject matter.

FIG. 5A illustrates a schematic diagram of the two-tier stacked etching process and associated parameters.

Metrology measurements 502 illustrate a top layer and a bottom layer of wafers processed using the two-tier stacked etching process. In particular, metrology measurements 502 includes an HVSEM of the upper layer 504 and an HVSEM of the bottom layer 506. Note that both the upper layer and the bottom layer can include high aspect ratio holes, where a hole has a relatively high depth to width CD ratio.

A dimple in bottom layer 506 may be etched via ions which pass through a top hole 508 to the bottom layer. In some embodiments, top hole 508 may have a CD within a range of about 20-60 nanometers, within a range of about 30-50 nanometers, etc. After passing through the top layer, the ions may then etch a dimple in the bottom layer. In some embodiments, the dimple can have an etch depth of within a range of about 0-70 nanometers, within a range of about 20-50 nanometers, within a range of about 0-20 nanometers, etc. Each dimple can be described as having a dimple volume that is a product of the etch depth and the etch area. It should be noted that a protective liner may be applied to a sidewall portion associated with the dimple, which may be applied prior to the etching process. Ideally, the etching process will produce a dimple with a desired etch depth without etching away or damaging the protective liner of the sidewall Each ion follows an ion path 510. Ion path 510 is confined by a deposition process that is performed prior to the etching process. Joint 512 depicts a region where the top layer and the bottom layer are stacked. The CD of Joint 512 may be within a range of about 30-50 nanometers, within a range of about 35-45 nanometers, etc.

In some cases, however, an ion path may have a tilt angle 514. For example, tilt angle 514 may be introduced during stacking of the top layer and the bottom layer, such as in an instance in which the top layer and the bottom layer are not aligned with respect to the joint. Tilt angle 514 may introduce an offset between ion path 510 relative to joint 512. This offset may be characterized by an offset radius 518. The overlapping portion between ion path 510 and joint 512 is indicated as an overlap area 520.

Note that, overlap area 520 corresponds to a dimple that is etched. In some embodiments, overlap area 520 may correspond to a pre-processing dimension that is matched to a post-processing dimension of dimple volume, as described below in connection with FIG. 5B. A non-overlap area 522 as shown in FIG. 5A corresponds to an area in which ion path 510 does not overlap joint 512. Accordingly, non-overlap area 522 may correspond to an area at which a protective liner of a sidewall is etched away. In some embodiments, non-overlap area 522 may correspond to a pre-processing dimension that is matched to a post-processing dimension of liner loss area, as described below in connection with FIG. 5C.

Figures 5B, 5C:
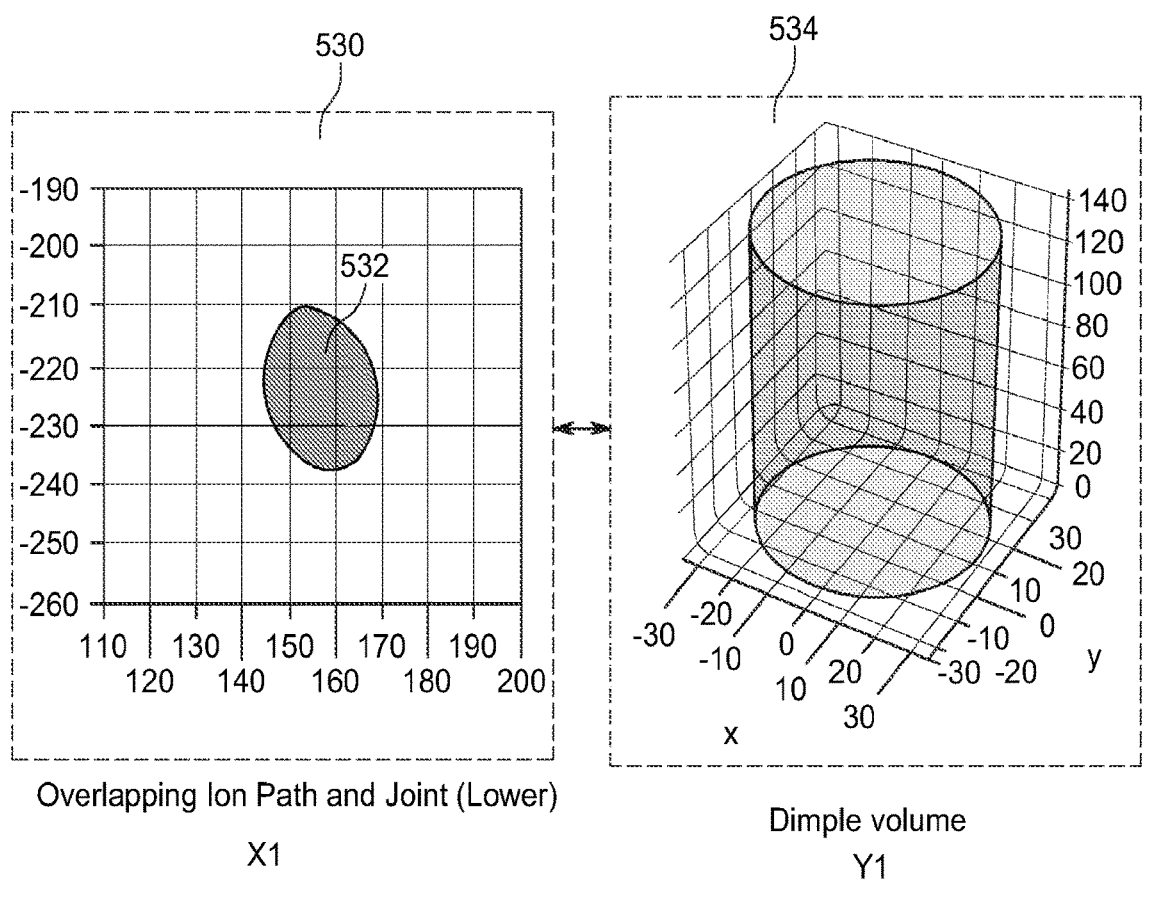
FIGS. 5B and 5C illustrate pre-processing dimensions and post-processing dimensions that can be matched for the etching process illustrated in FIG. 5A in accordance with some embodiments of the disclosed subject matter.

In some embodiments, values of a dimension used for matching pre-processing and post-processing samples can be calculated or generated using a model. FIGS. 5B and 5C show diagrams for calculating values for a pre-processing dimension, X1, using an ion confinement model for two-tier stacked etching process shown in and described above in connection with FIG. 5A.

FIG. 5B shows dimensions used for matching pre-processing samples and post-processing samples in an instance in which an ion path from a top layer to a bottom layer overlaps with the desired joint location.

Graph 530 shows a calculated overlap area 532 that is used as a value of the X1 dimension used for matching. Overlap area 532 is a scalar value that indicates an area by which a dimple produced by an ion used for etching overlaps a joint, as shown in and described above in connection with FIG. 5A.

Overlap area 532 is calculated using an ion confinement model that calculates the value of overlap area 532. The ion confinement model can include any suitable equations or other representations that encompass, for example, a position of an ion reaching a bottom layer when having a particular tilt angle, temperature information, ion species information etc. As a more particular example, overlap area 532 can be calculated based on geometric information obtained from HVSEM images of a top layer and a bottom layer, such as HVSEM of the bottom layer 502 and HVSEM of the upper layer 504.

In some embodiments, the Y1 dimension used for matching can be the volume of the resulting dimple on the bottom layer, as shown in graph 534. The dimple volume can be calculated based on metrology measurements of etch area and etch depth.

FIG. 5C shows dimensions used for matching pre-processing and post-processing samples in an instance in which the ion path does not overlap the desired joint location.

Graph 540 shows a calculated miss area 542 that is used as a value of the X1 dimension used for matching. Miss area 542 is a scalar value that indicates an area by which an ion missed the joint location. Similarly to what is described above in connection with overlap area 532 of FIG. 5B, miss area 542 can be calculated using the ion confinement model.

In some embodiments, the Y1 dimension used for matching can be a metrology measurement that indicates a liner loss area. The liner loss area indicates an area of protective liner on a sidewall that has been etched away. Graph 544 shows a liner loss area calculation that can be used as the Y1 matching value.

Recall from FIGS. 2 and 3C that after pre-processing samples and post-processing samples are matched using the X1 and Y1 dimensions, values of other dimensions (X2, X3, Y2, Y3, etc.) are likewise connected. The resulting dataset is therefore multi-dimensional, with pre-processing samples matched to post-processing samples with matched values for multiple pre-processing dimensions and multiple post-processing dimensions.

Figure 6:
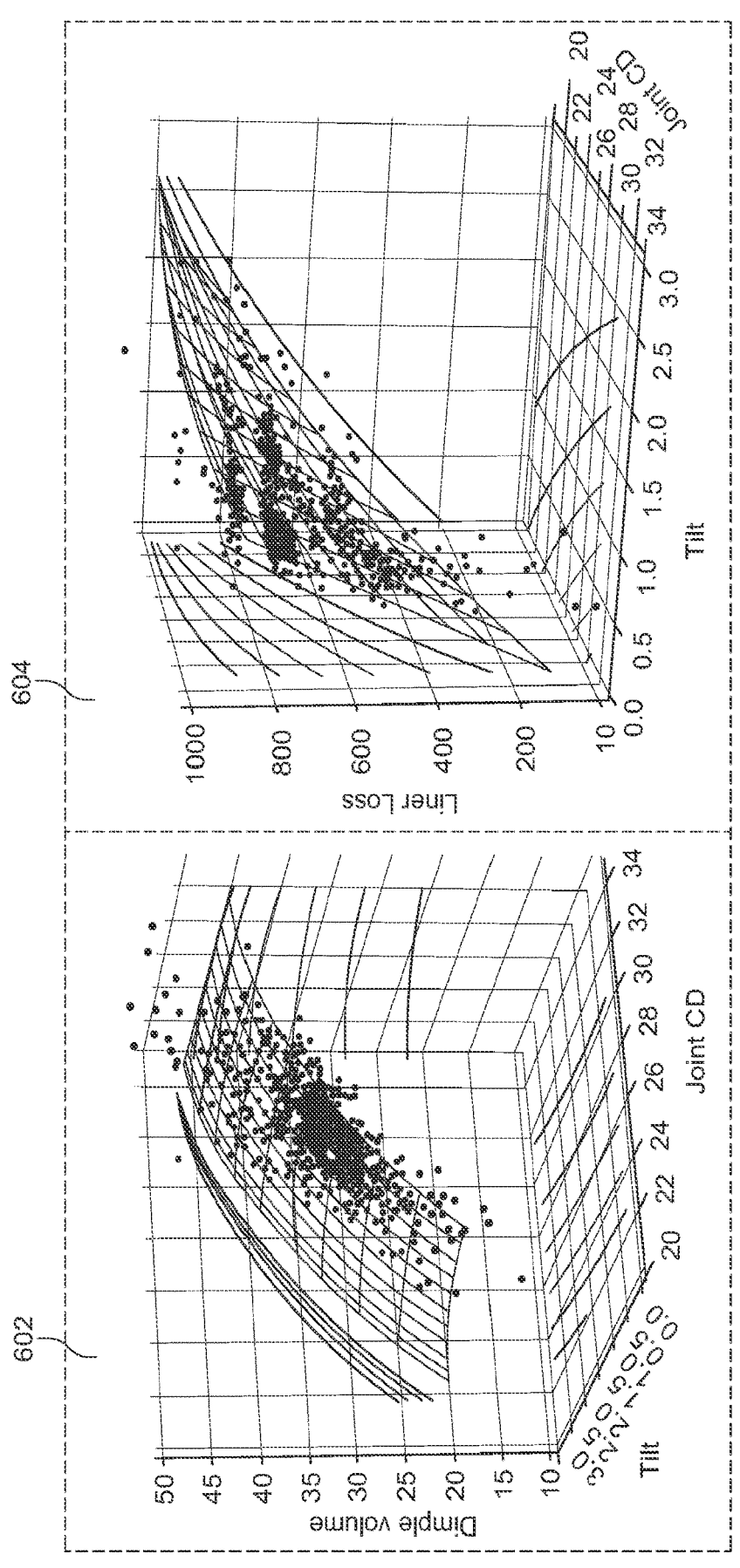
FIG. 6 shows example graphs for evaluating the etching process illustrated in FIG. 5A after multi-dimensional sample matching in accordance with some embodiments of the disclosed subject matter.

The multi-dimensional relationships can be analyzed for multiple purposes, such as to identify shifts or modifications in pre-processing dimensions that will mitigate or decrease a likelihood of a process failure. Note that FIGS. 6, 7A, and 7B depict the matched, multi-dimensional dataset and use of the matched, multi-dimensional dataset for failure mitigation with respect to the two-tier stacked etching process shown in and described above in connection with FIGS. 5A, 5B, and 5C. FIG. 8 shows a generalized example flowchart for using a matched, multi-dimensional dataset for failure mitigation.

FIG. 6 shows multi-dimensional plots that can be constructed to show multi-dimensional relationships between pre-processing sample dimensions and post-processing sample dimensions with respect to the two-tier stacked etching process shown in and described above in connection with FIGS. 5A, 5B, and 5C.

Graph 602 shows multi-dimensional relationships in instances in which the ion path overlaps with the desired joint location. Recall that (as shown in FIG. 5B), in these instances, the matching relationship uses the X1 dimension of overlap area (between the ion path and the joint) and the Y1 dimension of dimple volume, where the overlap area is calculated using an ion confinement model.

In some embodiments, the pre-processing dimensions can additionally include tilt angle (X2) and joint CD (X3). Tilt angle (shown in FIG. 5A) describes the angle deviation from a straight vertical path, and joint CD describes a CD of where the two stacked tiers connect. As described above in connection with FIGS. 2 and 3C, after samples have been matched using the values of the X1 and Y1 dimensions, the sample values corresponding to the X2 and X3 dimensions can correspondingly be connected. Graph 602 therefore shows dimple volume (i.e., the Y1 values) as a function of tilt angle (i.e., the X2 values) and joint CD (i.e., the X3 values) after the X2 and X3 dimensions have been connected.

Graph 604 shows multi-dimensional relationships in instances in which the ion path does not overlap with the desired joint location. Recall that (as shown in FIG. 5C), in these instances, the matching relationship uses the X1 dimension of miss area and the Y1 dimension of liner loss area, where the miss area is calculated using an ion confinement model.

In some embodiments, the pre-processing dimensions can additionally include tilt angle (X2) and joint CD (X3), described above in connection with graph 602. Similarly to what is described above, after samples have been matched using the values of X1 and Y1 dimensions, the sample values corresponding to the X2 and X3 dimensions can correspondingly be connected. Graph 604 therefore shows liner loss area (i.e., the Y1 values) as a function of tilt angle (i.e., the X2 values) and joint CD (i.e., the X3 values) after the X2 and X3 dimensions have been connected.

FIG. 7A shows contour plots that can be used to identify modifications to process parameters to decrease a number of failures with respect to the two-tier stacked etching process shown in and described above in connection with FIGS. 5A, 5B, and 5C.

In some embodiments, a failure can be classified based on values of any suitable post-processing features meeting particular failure criteria. For example, with respect to the two-tier stacked etching process, a failure can be classified when 1) a dimple volume is less than a threshold dimple volume; and/or 2) a liner loss area exceeds a threshold liner loss area. In some embodiments, failure can be binary such that a wafer that satisfies either of the above failure criteria (i.e., not meeting a minimum dimple volume or exceeding a maximum liner loss area) is classified as a failure, and conversely, a wafer that does not satisfy either of the above failure criteria is classified as satisfactory or not failing.

Contour plot 702 of FIG. 7A shows the distribution of on-wafer features classified as failing as a function of particular values of tilt and joint CD. Note that in contour plots 702 and 704, region 706 indicates denser distribution of features, and failure zones 708 indicates regions where on-wafer features are generally classified as failing.

Contour plot 704 of FIG. 7A shows the distribution of wafers classified as failing as a function of identified recommended values of tilt and joint CD. The recommended values can represent a recommendation to keep tilt angles below a particular value (e.g., less than five nanometers, less than three nanometers, etc.) and/or a recommendation to increase a joint CD by a particular amount (e.g., one nanometer, two nanometers, etc.). Note that the failure zone of contour plot 704 has shifted such that a higher percentage of wafers are classified as passing as a result of the recommended changes to tilt and/or joint CD.

Note that contour plot 704 can be generated based on the graphs 602 and 604 of FIG. 6. For example, a dimple volume failure can be classified as dimple volumes below a dimple volume threshold. Continuing with this example, a planar cut at the level of the dimple volume threshold on graph 602 can be used to identify values of tilt and values of joint CD that generate dimple volume failures, and, conversely, satisfactory dimple volumes. Continuing further with this example, a liner loss area failure can be classified as liner loss areas exceeding a liner loss threshold. Continuing still further with this example, a planar cut at the level of the liner loss threshold on graph 604 can be used to identify values of tilt and values of joint CD that generate liner loss area failures, and, conversely, satisfactory amounts of liner loss. Contour plot 704 can then be constructed by superposing graphs generated by the planar cuts of graph 602 and 604.

FIG. 7B shows graphs constructed from multi-dimensional matched pre-processing and post-processing samples, where matching is conducted on whole wafer samples.

Graphs 750 and 752 illustrate matched samples with two different stacked etching processes, respectively. In each of graphs 750 and 752, two whole wafers are analyzed, where wafer variations between the two wafers are larger for the wafers associated with graph 752 than for the wafers associated with group 750. In graphs 750 and 752, the z axis corresponds to a failure rate based on calculations used to generate contour plots 702 and 704, and the x and y axes correspond to x and y wafer coordinates, respectively. Note that, for each of graphs 750 and 752, each process was implemented twice, and matching of pre-processing and post-processing samples was performed on whole wafer samples.

Graphs 750 and 752 additionally show contour plots 762 and 764, respectively, that correspond to contour plots of planes of graphs 750 and 752.

As illustrated in graphs 750 and 752, after matching pre-processing and post-processing samples, process variation can be decoupled from wafer variation, even when matching is done on whole wafer samples. Each of contours 754-760 in graphs 750 and 752 illustrate a failure analysis of a different wafer. In particular, with respect to graph 750, in an instance in which the two analyzed wafers are similar, the failure rates associated with each of the two wafers are similar, as illustrated by the similar contours 754 and 756. Continuing further, graph 752 shows different failure rates (as illustrated by contours 758 and 760) associated with each of the wafers analyzed to generate graph 752, where the different failure rates are due to larger wafer variations between the two wafers. Moreover, variations between the etching process associated with graph 750 and the etching process associated with graph 752 can be observed due to the differences in contours 754 and 756 of graph 750 relative to contours 758 and 760 of graph 752.

Generating Recommendations to Mitigate Failures

Turning to FIG. 8, a flowchart that illustrates operations of a processor for generating recommendations to mitigate failures based on matched pre-processing samples and post-processing samples is shown in accordance with some embodiments of the disclosed subject matter.

At 802, a dataset of multi-dimensional matched samples can be received, where each sample is associated with sample values for pre-processed sample dimensions (e.g., $X1, X2, \ldots XN$) and post-processing sample dimensions (e.g., $Y1, Y2, \ldots YM$). For example, the received dataset can be in a format similar to what is shown in and described above in connection with the table of FIG. 3C. In some embodiments, the dataset can be constructed using the techniques shown in and described above in connection with FIG. 2.

At 804, an indication of a failure criteria can be received. In some embodiments, the failure criteria can indicate threshold values for particular post-processing dimensions (e.g., $Y1, Y2, \ldots YM$) that constitute a failure of the post-processed substrate. Example failure criteria can include an etch depth that is less than a threshold depth, a post-processing CD that is less than a desired CD, etc.

As a more particular example, as described above in connection with the two-tier stacked etching process in FIG. 7A, the failure criteria can include a dimple volume being below a minimum volume threshold and/or a liner loss area exceeding a liner loss threshold. Note that this is merely exemplary, and in some embodiments, the failure criteria can be specific to any suitable process.

In some embodiments, the failure criteria can be specified manually, for example, by a process engineer. Additionally or alternatively, in some embodiments, the failure criteria can be retrieved from a database, such as a failure database that indicates specifications for various manufacturing processes.

At 806, values of the pre-processing sample dimensions likely to generate failures can be identified based on the failure criteria and the dataset of multi-dimensional matched samples. Note that the pre-processing sample dimensions may be identified as dimensions that can be practicably controlled or modified, such as a pre-processing CD, a tilt angle, etc.

For example, a graph can be constructed that plots values of a post-processing dimension of interest as a function of values of one or more pre-processing dimensions of interest. Continuing with this example, a plane corresponding to a horizontal cut of the graphs can be used to identify the values pre-processing sample dimensions, where the plane is located at a Z-axis value corresponding to a failure threshold.

As a specific example, in an instance in which a wafer is classified as failing when a dimple volume is less than a minimum dimple volume threshold, the plane can be located at the minimum dimple volume threshold (i.e., on graph 602 of FIG. 6). Continuing with this particular example, values of tilt angle and joint CD that produce dimple volumes below the plane (i.e., below the minimum dimple volume threshold) can then be identified.

As another specific example, in an instance in which a wafer is classified as failing when a liner loss area exceeds a maximum allowable loss threshold, the plane can be located at the maximum allowable loss threshold (i.e., on graph 604 of FIG. 6). Continuing with this particular example, values of tilt angle and joint CD that produce liner loss areas above the plane (i.e., above the maximum allowable loss threshold) can then be identified.

In some embodiments, at 808, one or more modifications to values of the pre-processed sample dimensions can be identified to decrease the number of failures and/or to shift a failure distribution. For example, in some embodiments, values of the pre-processed sample dimensions that are likely to produce post-processing sample dimension values that are not classified as failures can be identified. Note that, in some embodiments, block 808 can be omitted.

As a more particular example, with respect to the multi-dimensional matched samples of the two-tier stacked etching process shown in and described above in connection with FIG. 6, tilt angles and/or joint CDs that are less likely to produce dimple volumes classified as a failure (i.e., that are less than a minimum allowable dimple volume threshold) can be identified. As another more particular example, tilt angles and/or joint CDs that are less likely to produce liner loss areas classified as a failure (i.e., that exceed a maximum allowable liner loss) can be identified.

After identifying the one or more modifications to the values of the pre-processed sample dimensions, a recommendation can be presented that indicates the identified one or more modifications. For example, a recommendation can be presented (e.g., to a process engineer) that indicates that a pre-processing CD should be shifted or increased by a particular amount, that a tilt angle should be kept below a particular amount, etc.

The process can end at 810.

Applications

By mapping features of a pre-processed substrate to features on the substrate post-processing, the techniques described herein allow a process engineer to decouple the effects of wafer variations from process variations. In particular, by decoupling the effects of wafer variations from process variations, a process engineer can evaluate various characteristics of a particular process, such as sensitivity of the process to changes in one or more process conditions.

Additionally, a relationship between a post-processing dimension (e.g., post-processing CD, etch depth or volume, liner loss area, etc.) and a pre-processing dimension (e.g., pre-processing CD, ion tilt, etc.) can be provided such that a process engineer can identify an effect of a change in a particular pre-processing dimension on a post-processing dimension of interest. As a specific example, in an instance in which a liner loss area on a sidewall during an etching process should be minimized, a process engineer can use a relationship between the liner loss area and one or more pre-processing dimensions (e.g., ion tilt during etching, pre-processing CD, etc.) to identity optimal values of the pre-processing dimensions to minimize the liner loss area.

Accordingly, the techniques described herein for matching pre-processed substrate features to features on the substrate post-processing can improve fabrication processes by allowing a process engineer to quickly identify the on-wafer effect of process condition changes that will provide improved post-processing substrate features. For example, by identifying relationships between pre-processing and post-processing dimensions, a process engineer does not have to utilize trial and error to identify potential process condition changes, thus saving time and other resources.

Context for Disclosed Computational Embodiments

Certain embodiments disclosed herein relate to computational systems for matching pre-processing substrate samples and post-processing substrate samples.

Many types of computing systems having any of various computer architectures may be employed as the disclosed systems for implementing algorithms as described herein. For example, the systems may include software components executing on one or more general purpose processors or specially designed processors such as Application Specific Integrated Circuits (ASICs) or programmable logic devices (e.g., Field Programmable Gate Arrays (FPGAs)). Further, the systems may be implemented on a single device or distributed across multiple devices. The functions of the computational elements may be merged into one another or further split into multiple sub-modules.

In some embodiments, code executed during generation or execution of a technique for matching sample dimensions on an appropriately programmed system can be embodied in the form of software elements which can be stored in a nonvolatile storage medium (such as optical disk, flash storage device, mobile hard disk, etc.), including a number of instructions for making a computer device (such as personal computers, servers, network equipment, etc.).

At one level a software element is implemented as a set of commands prepared by the programmer/developer. However, the module software that can be executed by the computer hardware is executable code committed to memory using "machine codes" selected from the specific machine language instruction set, or "native instructions," designed into the hardware processor. The machine language instruction set, or native instruction set, is known to, and essentially built into, the hardware processor(s). This is the "language" by which the system and application software communicates with the hardware processors. Each native instruction is a discrete code that is recognized by the processing architecture and that can specify particular registers for arithmetic, addressing, or control functions; particular memory locations or offsets; and particular addressing modes used to interpret operands. More complex operations are built up by combining these simple native instructions, which are executed sequentially, or as otherwise directed by control flow instructions.

The inter-relationship between the executable software instructions and the hardware processor is structural. In other words, the instructions per se are a series of symbols or numeric values. They do not intrinsically convey any information. It is the processor, which by design was pre-configured to interpret the symbols/numeric values, which imparts meaning to the instructions.

The methods and techniques used herein may be configured to execute on a single machine at a single location, on multiple machines at a single location, or on multiple machines at multiple locations. When multiple machines are employed, the individual machines may be tailored for their particular tasks. For example, operations requiring large blocks of code and/or significant processing capacity may be implemented on large and/or stationary machines.

In addition, certain embodiments relate to tangible and/or non-transitory computer readable media or computer program products that include program instructions and/or data (including data structures) for performing various computer-implemented operations. Examples of computer-readable media include, but are not limited to, semiconductor memory devices, phase-change devices, magnetic media such as disk drives, magnetic tape, optical media such as CDs, magneto-optical media, and hardware devices that are specially configured to store and perform program instructions, such as read-only memory devices (ROM) and random access memory (RAM). The computer readable media may be directly controlled by an end user or the media may be indirectly controlled by the end user. Examples of directly controlled media include the media located at a user facility and/or media that are not shared with other entities. Examples of indirectly controlled media include media that is indirectly accessible to the user via an external network and/or via a service providing shared resources such as the "cloud." Examples of program instructions include both machine code, such as produced by a compiler, and files containing higher level code that may be executed by the computer using an interpreter.

In various embodiments, the data or information employed in the disclosed methods and apparatus is provided in an electronic format. Such data or information may include metrology measurements, cumulative distributions, and the like. As used herein, data or other information provided in electronic format is available for storage on a machine and transmission between machines. Conventionally, data in electronic format is provided digitally and may be stored as bits and/or bytes in various data structures, lists, databases, etc. The data may be embodied electronically, optically, etc.

System software typically interfaces with computer hardware and associated memory. In some embodiments, the system software includes operating system software and/or firmware, as well as any middleware and drivers installed in the system. The system software provides basic non-task-specific functions of the computer. In contrast, the modules and other application software are used to accomplish specific tasks. Each native instruction for a module is stored in a memory device and is represented by a numeric value.

Figure 9:
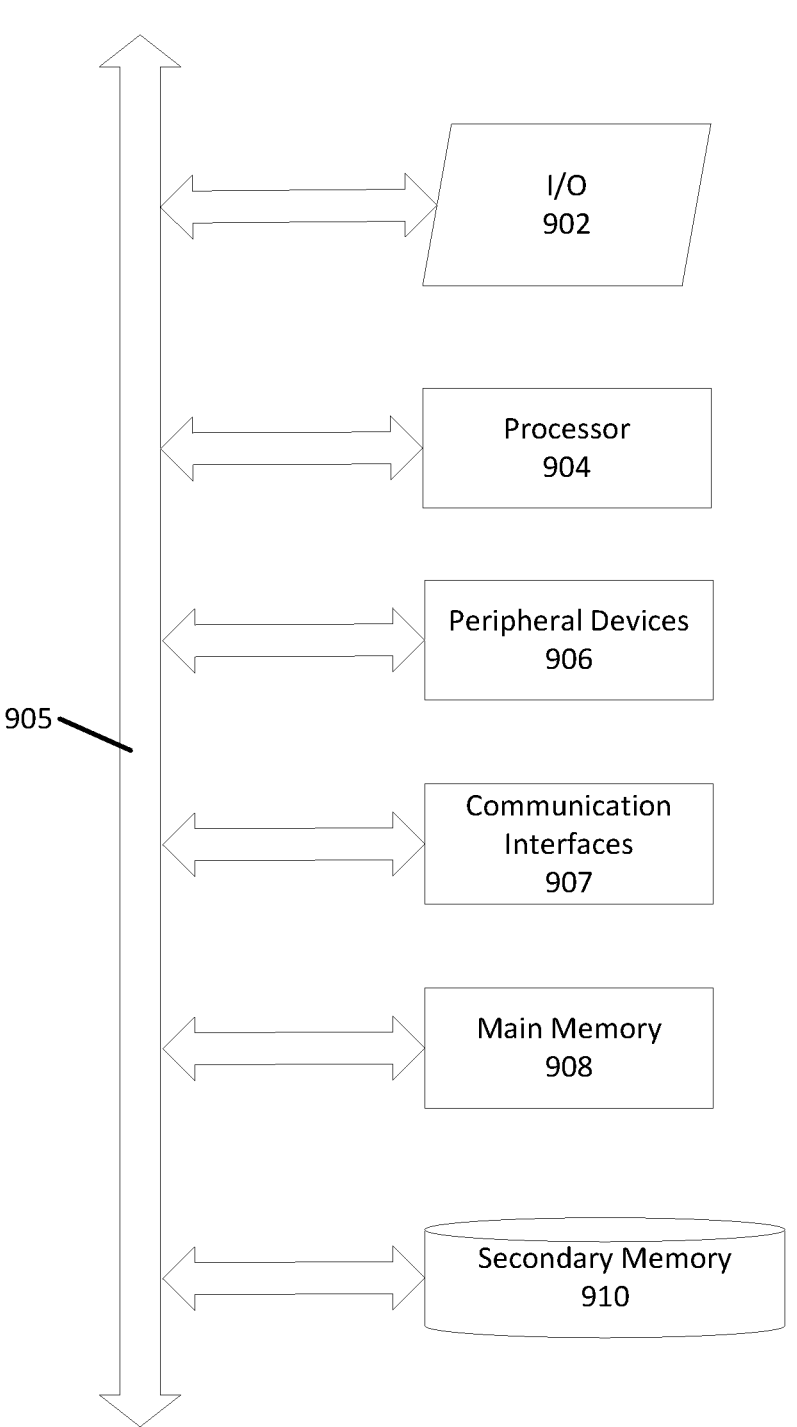
FIG. 9 presents an example computer system that may be employed to implement certain embodiments described herein.

An example computer system 900 is depicted in FIG. 9. As shown, computer system 900 includes an input/output subsystem 902, which may implement an interface for interacting with human users and/or other computer systems depending upon the application. Embodiments of the disclosure may be implemented in program code on system 900 with I/O subsystem 902 used to receive input program statements and/or data from a human user (e.g., via a GUI or keyboard) and to display them back to the user. The I/O subsystem 902 may include, e.g., a keyboard, mouse, graphical user interface, touchscreen, or other interfaces for input, and, e.g., an LED or other flat screen display, or other interfaces for output.

Communication interfaces 907 can include any suitable components or circuitry used for communication using any suitable communication network (e.g., the Internet, an intranet, a wide-area network (WAN), a local-area network (LAN), a wireless network, a virtual private network (VPN), and/or any other suitable type of communication network). For example, communication interfaces 907 can include network interface card circuitry, wireless communication circuitry, etc.

Program code may be stored in non-transitory media such as secondary memory 910 or memory 908 or both. In some embodiments, secondary memory 910 can be persistent storage. One or more processors 904 reads program code from one or more non-transitory media and executes the code to enable the computer system to accomplish the methods performed by the embodiments herein. Those skilled in the art will understand that the processor may accept source code, such as statements for executing training and/or modelling operations, and interpret or compile the source code into machine code that is understandable at the hardware gate level of the processor. A bus 905 couples the I/O subsystem 902, the processor 904, peripheral devices 906, communication interfaces 907, memory 908, and secondary memory 910.

CONCLUSION

In the description, numerous specific details were set forth in order to provide a thorough understanding of the presented embodiments. The disclosed embodiments may be practiced without some or all of these specific details. In other instances, well-known process operations were not described in detail to not unnecessarily obscure the disclosed embodiments. While the disclosed embodiments were described in conjunction with the specific embodiments, it will be understood that the specific embodiments are not intended to limit the disclosed embodiments.

Unless otherwise indicated, the method operations and device features disclosed herein involves techniques and apparatus commonly used in metrology, semiconductor device fabrication technology, software design and programming, and statistics, which are within the skill of the art.

Unless defined otherwise herein, all technical and scientific terms used herein have the same meaning as commonly understood by one of ordinary skill in the art. Various scientific dictionaries that include the terms included herein are well known and available to those in the art. Although any methods and materials similar or equivalent to those described herein find use in the practice or testing of the embodiments disclosed herein, some methods and materials are described.

Numeric ranges are inclusive of the numbers defining the range. It is intended that every maximum numerical limitation given throughout this specification includes every lower numerical limitation, as if such lower numerical limitations were expressly written herein. Every minimum numerical limitation given throughout this specification will include every higher numerical limitation, as if such higher numerical limitations were expressly written herein. Every numerical range given throughout this specification will include every narrower numerical range that falls within such broader numerical range, as if such narrower numerical ranges were all expressly written herein.

The headings provided herein are not intended to limit the disclosure.

As used herein, the singular terms "a," "an," and "the" include the plural reference unless the context clearly indicates otherwise. The term "or" as used herein, refers to a non-exclusive or, unless otherwise indicated.

Various computational elements including processors, memory, instructions, routines, models, or other components may be described or claimed as "configured to" perform a task or tasks. In such contexts, the phrase "configured to" is used to connote structure by indicating that the component includes structure (e.g., stored instructions, circuitry, etc.) that performs the task or tasks during operation. As such, the unit/circuit/component can be said to be configured to perform the task even when the specified component is not necessarily currently operational (e.g., is not on).

The components used with the "configured to" language may refer to hardware—for example, circuits, memory storing program instructions executable to implement the operation, etc. Additionally, "configured to" can refer to generic structure (e.g., generic circuitry) that is manipulated by software and/or firmware (e.g., an FPGA or a general-purpose processor executing software) to operate in manner that is capable of performing the recited task(s). Additionally, "configured to" can refer to one or more memories or memory elements storing computer executable instructions for performing the recited task(s). Such memory elements may include memory on a computer chip having processing logic. In some contexts, "configured to" may also include adapting a manufacturing process (e.g., a semiconductor fabrication facility) to fabricate devices (e.g., integrated circuits) that are adapted to implement or perform one or more tasks

What is claimed is:

1. A computer program product for matching pre-processing substrate samples and post-processing substrate samples comprising a non-transitory computer readable medium on which is provided computer-executable instructions for:
   receiving a plurality of samples associated with a first set of dimensions characterizing a pre-processed substrate and a plurality of samples associated with a second set of dimensions characterizing a post-processed substrate;
   receiving an identification of one of the pre-processed dimensions and one of the post-processed dimensions that are to be matched;
   generating a first probability distribution of samples for the identified pre-processed dimension and a second probability distribution of samples for the identified post-processed dimension; and
   matching samples of the identified pre-processed dimension to samples of the identified post-processed dimension based on the first probability distribution and the second probability distribution.

2. The computer program product of claim 1, wherein the identification is based on finding a monotonic relationship between values of the one of the pre-processed dimensions and the one of the post-processed dimensions.

3. The computer program product of claim 1, wherein the first probability distribution and the second probability distribution are each a cumulative distribution function, and wherein a value of the identified pre-processed dimension is matched to a value of the identified post-processed dimension based on the value of the identified pre-processed substrate having a substantially similar probability of occurrence as the value of the identified post-processed dimension in their respective cumulative distribution functions.

4. The computer program product of claim 1, further comprising computer-executable instructions for matching values of one or more remaining pre-processed dimensions with values of one or more remaining post-processed dimensions based on the matching samples of the identified pre-processed dimension and the identified post-processed dimension.

5. The computer program product of claim 1, wherein the identified pre-processed dimension is a pre-processing Critical Dimension (CD) measurement.

6. The computer program product of claim 1, wherein the identified post-processed dimension is a post-processing Critical Dimension (CD) measurement.

7. The computer program product of claim 1, wherein values of the identified pre-processed dimension are generated using a model.

8. The computer program product of claim 7, wherein the model is an ion confinement model that predicts a path of an ion used to etch two stacked substrate layers.

9. The computer program product of claim 8, further comprising computer-executable instructions for:
   determining, based on the ion confinement model, whether the ion passed through a joint at which the two substrate layers are stacked; and
   selecting the identified pre-processed dimension that is to be matched based on the determination of whether the ion passed through the joint.

10. The computer program product of claim 9, wherein it is determined that the ion passed through the joint, and wherein the identified pre-processed dimension corresponds to a cross-sectional area that indicates an overlap between the path of the ion and the joint.

11. The computer program product of claim 10, wherein the identified post-processed dimension corresponds to an etch volume on a bottom layer of the two substrate layers.

12. The computer program product of claim 9, wherein it is determined that the ion did not pass through the joint, and wherein the identified pre-processed dimension corresponds to a cross-sectional area that indicates a difference between the path of the ion and the joint.

13. The computer program product of claim 12, wherein the identified post-processed dimension corresponds to a liner loss area of a sidewall.

14. A computer program product for evaluating semiconductor manufacturing processes comprising a non-transitory computer readable medium on which is provided computer-executable instructions for:
   receiving a dataset that comprises a first plurality of samples having pre-processing dimensions matched with a second plurality of samples having post-processing dimensions, wherein the first plurality of samples has been matched with the second plurality of samples based on a first probability distribution of sample values of one of the pre-processing dimensions and a second probability distribution of sample values of one of the post-processing dimensions;
   identifying a criterion for any given one of the post-processing dimensions that indicates a process failure based on values of the given post-processing dimensions relative to a threshold value; and
   identifying a potential cause for process failure based on values of a pre-processing dimension matched to the given post-processing dimension.

15. The computer program product of claim 14, wherein values of the given post-processing dimension that exceed the threshold value indicate the process failure.

16. The computer program product of claim 15, further comprising computer-executable instructions for identifying a modification of values of the pre-processing dimension that generates values of the given post-processing dimension that are below the threshold value.

17. The computer program product of claim 15, wherein the given post-processing dimension corresponds to a liner loss area of a side wall during etching of two stacked substrate layers.

18. The computer program product of claim 14, wherein values of the given post-processing dimension that are below the threshold value indicate the process failure.

19. The computer program product of claim 18, further comprising computer-executable instructions for identifying a shift in values of the pre-processing dimension that generates values of the given post-processing dimension that exceed the threshold value.

20. The computer program product of claim 18, wherein the given post-processing dimension corresponds to an etch volume during etching of two stacked substrate layers.

21. The computer program product of claim 20, wherein the pre-processing dimension corresponds to a critical dimension (CD) of a joint at which the two substrate layers are stacked.

22. The computer program product of claim 20, wherein the pre-processing dimension is an angle at which an ion passes through a top layer of the two stacked substrate layers to a bottom layer of the two stacked substrate layers.

23. The computer program product of claim 14, wherein at least one of the one of the pre-processing dimensions and the one of the post-processing dimensions are generated by a computational model.

* * * * *